(12) United States Patent
Gu et al.

(10) Patent No.: US 9,502,232 B2
(45) Date of Patent: Nov. 22, 2016

(54) INHIBITING DIFFUSION OF ELEMENTS BETWEEN MATERIAL LAYERS OF A LAYERED CIRCUIT STRUCTURE

(71) Applicant: GLOBALFOUNDRIES Inc., Grand Cayman (KY)

(72) Inventors: Sipeng Gu, Clifton Park, NY (US); Sandeep Gaan, Clifton Park, NY (US); Zhiguo Sun, Halfmoon, NY (US); Huang Liu, Mechanicville, NY (US); Adam Selsley, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 215 days.

(21) Appl. No.: 14/321,866

(22) Filed: Jul. 2, 2014

(65) Prior Publication Data

US 2016/0005598 A1 Jan. 7, 2016

(51) Int. Cl.
*H01L 21/02* (2006.01)
*H01L 21/321* (2006.01)

(52) U.S. Cl.
CPC ... *H01L 21/02164* (2013.01); *H01L 21/02216* (2013.01); *H01L 21/02274* (2013.01); *H01L 21/321* (2013.01)

(58) Field of Classification Search
CPC .................. H01L 21/02208; H01L 21/02282; H01L 21/0234; H01L 21/02356; H01L 21/02359
USPC ........................................................ 438/763
See application file for complete search history.

(56) References Cited

U.S. PATENT DOCUMENTS

| 2002/0001976 A1* | 1/2002 | Danek | C23C 16/34 438/798 |
| 2011/0057220 A1* | 3/2011 | Mochida | B82Y 20/00 257/98 |
| 2012/0093186 A1* | 4/2012 | Murayama | B82Y 20/00 372/44.01 |

OTHER PUBLICATIONS

F. Fillot, "Study of Metal Gate Work Function Modulation Using Plasma and SiH4 Treated TiN Thin Films", Mat. Res. Soc. Symp. Proc. vol. 786, 2004 Materials Research Society, 7 pages.

* cited by examiner

*Primary Examiner* — David Vu
*Assistant Examiner* — Jonathan Han
(74) *Attorney, Agent, or Firm* — Heslin Rothenberg Farley & Mesiti P.C.; Nathan Davis

(57) ABSTRACT

Methods for fabricating a layered circuit structure are provided, which include, for instance: depositing a first material layer above a substrate, the first material layer having an oxidized upper surface; providing a second material layer over the oxidized upper surface of the first material layer; and inhibiting diffusion of one or more elements from the oxidized upper surface of the first material layer into either the first material layer or the second material layer during the providing of the second material layer over the oxidized upper surface of the first material layer. The inhibiting may include one or more of modifying a characteristic(s) of the first material layer, forming a protective layer over the oxidized upper surface of the first material layer, or altering at least one process parameter employed in providing the second material layer.

20 Claims, 11 Drawing Sheets

INHIBITING DIFFUSION OF ELEMENTS BETWEEN MATERIAL LAYERS OF A LAYERED CIRCUIT STRUCTURE

BACKGROUND

Circuit structure fabrication, such as transistor fabrication typically involves several processing steps of patterning and etching to form the desired circuit structures. During each processing step, materials may, for instance, be deposited on, or etched from a semiconductor wafer being processed. Because each step of a fabrication process may introduce complexity and cost, it is desirable to reduce or minimize defects within or between materials used in the process in order to maximize fabrication efficiency and enhance commercial advantage.

BRIEF SUMMARY

The shortcomings of the prior art are overcome and additional advantages are provided through the provision, in one aspect, of a method for fabricating a layered circuit structure. The method includes: depositing a first material layer above a substrate, the first material layer including an oxidized upper surface; providing a second material layer over the oxidized upper surface of the first material layer; and inhibiting diffusion of one or more elements from the oxidized upper surface of the first material layer into either the first material layer or the second material layer during the providing of the second material layer over the oxidized upper surface of the first material layer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
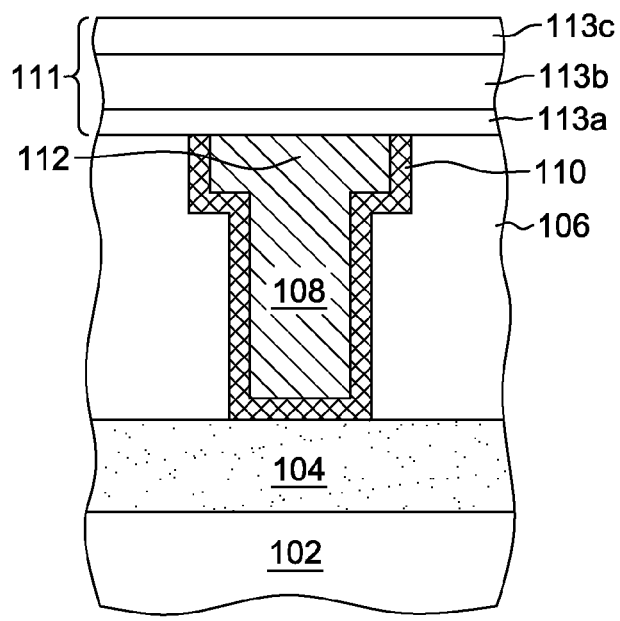
FIGS. 1A-1D depict one example of a process for fabricating a layered circuit structure, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used throughout difference figures designate the same or similar components.

Disclosed herein, in part are methods for inhibiting diffusion of one or more elements between specific types of layers such as between a layer of hard-mask material and a layer of dielectric material. During fabrication of certain circuit structures, multiple layers may be (for instance) provided over a semiconductor wafer. By way of example, circuit fabrication processing may include, for instance, providing adjacent, or even alternating layers of a hard-mask and a dielectric, with the dielectric layer(s) being patterned with interconnecting conductive structures (also referred to as interconnecting lines or wiring), for instance, to facilitate the desired interconnection of the semiconductor devices in an active device layer of the wafer as required to implement a particular integrated circuit design. Several issues may arise during the fabrication of a such layered circuit structure, which could negatively impact performance or yield of the resultant integrated circuits.

By way of example, the hard mask layer(s) which may act as a protective layer for one or more underlying layers during subsequent processing, may include or be fabricated of a nitride material, such as titanium nitride (TiN) or tantalum nitride (TaN), and the one or more dielectric layers, which may electrically isolate the respective conductive structures or circuit elements, may include or be fabricated of an oxide material, for example, silicon oxide ($SiO_2$), tetraethyl orthosilicate (TEOS) oxide, high density plasma (HDP) oxide, or a combination of such oxide materials. In practice, one skilled in the art will note that upper surfaces of, for instance, titanium nitride (TiN) hard-mask layers tend to become oxidized, upon exposure to atmospheric oxidation, forming an oxidized upper surface (for instance, a titanium oxynitride ($TiN_xO_y$) surface). The titanium-oxygen-nitrogen of the oxidized upper surface of the hard-mask layer may be susceptible to thermodynamic and/or electrochemical instabilities, during subsequent fabrication processing. As one example, the dielectric layer may be formed over the hard-mask layer via, for instance, a high temperature deposition process such as a plasma-enhanced chemical vapor deposition process. Disadvantageously, the high temperature deposition process could result in diffusion of one or more elements from the oxidized upper surface of the hard-mask layer into either the underlying hard-mask layer or the overlying dielectric layer being deposited, owing to the undesirable thermodynamic and/or electrochemical instabilities of the oxidized upper surface of the hard-mask layer(s). Such diffusion of one or more elements may disadvantageously, form one or more voids at the interface between the two layers which, in turn, could result in degradation of the resultant circuit device(s) or layered circuit structure.

By way of example, FIG. 1A depicts one embodiment of an intermediate structure 100 obtained during fabrication of a circuit structure. In the example shown, intermediate structure 100 includes a substrate 102, such as a semiconductor substrate (for instance, a silicon substrate). As another example, substrate 102 may include any silicon-containing substrate including, but not limited to, silicon (Si), single-crystal silicon, polycrystalline Si, amorphous Si, silicon-on-nothing (SON), silicon-on-insulator (SOI) or silicon-on-replacement insulator (SRI) substrates or the like.

During front-end of line (FEOL) processing, individual devices are created, for instance, in a device layer 104 disposed over substrate 102. As only an example, these individual devices may include metal-oxide-semiconductor field-effect transistors (MOSFETs) such as FinFETs, as well as capacitors, resistors and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or partially connected) semiconductor devices may be fabricated in device layer 104.

After FEOL processing, as well as middle-of-the-line (MOL) processing, back-end of line (BEOL) processing is performed. By way of example, the BEOL processing may include, for instance, silicidation of source and drain regions, deposition of a dielectric layers, and formation of vias and/or trenches in the dielectric layers as metal interconnect layers. During BEOL processing, one or more dielectric layers 106 such as, for instance, pre-metal dielectric (PMD) layers, interlayer dielectric (ILD) layers and intermetal dielectric layers (IMD) may be formed above device layer 104 so as to electrically isolate the respective circuit elements or conductive structures being formed. The dielectric layer(s) 106 may include, for example, silicon oxide deposited and patterned with a network of interconnecting conductive structures (also referred to as interconnecting lines or wiring), for instance, to facilitate the desired interconnection of semiconductor devices in device layer 104 as required to implement a particular integrated circuit design. The deposition of dielectric layer(s) 106, followed by subsequent processing to pattern, etch and fill trenches and vias with, for instance, conductive structures 108, may be repeated during BEOL processing such that several metal layers, for example, six to ten metal layers, are deposited and processed in a similar manner. Between each metal layer, hard-mask layers may be formed to protect the underlying layers during subsequent fabrication processing.

By way of example, dielectric layer 106 may be patterned, using conventional etch processes, to define one or more interconnecting conductive structure(s) 108. In one example, conductive structure 108 may include one or more liners 110 deposited within the patterned openings. A liner refers generally to any film or layer which may form part of the resultant conductive structure, and include (for instance) one or more conformally-deposited layers, such as one or more layers of titanium (Ti), carbon doped titanium, tungsten (W), tungsten nitride (WN), titanium nitride (TiN), tantalum nitride (TaN), titanium aluminum nitride (TiAlN) or the like. Liners 110 may be deposited using conventional deposition processes, for example, atomic layer deposition (ALD), chemical vapor deposition (CVD) or any other suitable process, and facilitate the forming of conductive structures 108 by the subsequent filling of openings with a conductive material 112, such as a metal, for instance, copper, tungsten or the like. A non-selective chemical-mechanical polish may be employed to polish away excess liners 110 and excess conductive material 112, with the chemical-mechanical polishing terminating at, for instance, conductive structure(s) 108, resulting in the height of conductive structure 108 being substantially equal to height of dielectric layer 106 as illustrated.

Further, as noted above, one skilled in the art will note that the BEOL fabrication processing may further include a multilayer stack structure 111 being deposited over the structure. The multilayer stack structure, for instance, may include an etch-stop layer 113a, a layer of dielectric material 113b disposed above etch-stop layer 113a, and a protective hard-mask layer 113c disposed above dielectric layer 113b.

By way of example, etch-stop layer 113a, which may facilitate a subsequent etching processing, may include or be fabricated of nitrogen-doped silicon carbide (N-Blok) material and hydrogen-doped silicon carbide (Blok) material. In another example, etch-stop layer 113a may also include or be fabricated of materials such as, for example, silicon nitride (SiN), silicon carbide (SiC), silicon carbonitride (SiCN) or a combination thereof or any other suitable material, which may be chosen to be compatible with the etch chemistry and technique to be employed. Etch-stop layer 113a may have a minimum thickness such that subsequent processing including an etching process for formation of opening in layers above the etch stop, will properly stop on or at etch-stop layer 113a with enough margin for error. Etch-stop layer 113a, in one embodiment, may be deposited using conventional deposition processes such as, for instance, atomic layer deposition (ALD), chemical vapor deposition (CVD) or the plasma-enhanced versions of the same.

Continuing further with FIG. 1A, a dielectric layer 113b may be provided over etch-stop layer 113b. Although not depicted in the figures, one skilled in the art will understand that the dielectric layer may typically be patterned to define one or more interconnecting conductive structure(s). For instance, the conductive structure(s) may include one or more conductive lines, which support electrical connections along a horizontally-extending length. In another example, conductive structure(s) may also include one or more contact vias which facilitate vertical electrical connection between BEOL metal layers of an integrated circuit.

By way of example, dielectric layer 113b may be deposited from a gaseous phase using any suitable conventional deposition processes, for instance, chemical vapor deposition (CVD), physical vapor deposition (PVD), atomic layer deposition (ALD) or from a liquid phase using a spin-on deposition process. In one example, dielectric layer 113b may include or be fabricated of, for instance, silicon oxide ($SiO_2$), silicon nitride (SiN or $Si_3N_4$), fluorinated silicate glass (FSG). In another example, dielectric layer 113b may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one specific example, dielectric layer 113b may include dense or porous materials such as, for example, silicon oxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$). In another specific example, dielectric layer 113b may also include spin-on organosilicate glass material, such as sol-gel films, for example, Nanoglass, and methylsilsesquioxane materials such as, JSR5108 or JSR5109 or LKD (available from JSR), porous SILK (available from Dow Chemical, Midland, Mich.), and BLACK DIAMOND or BLACK DIAMOND II (available from Applied Materials), CORAL (available from Novellus), mesoporous organosilicate glass (OSG), divinyl-siloxane bisbenzocyclobutene (BCB) or other organo dielectric materials having silicon-carbon-oxygen-hydrogen (SiCOH) composition.

Additionally, protective hard-mask layer 113c, which may be used to protect underlying structure during subsequent fabrication, may be provided over dielectric layer 113b. Protective layer 113c, in one specific example, may include or be fabricated of a nitride such as, for example, silicon nitride (SiN or $Si_3N_4$). The deposition process may include any conventional process such as, for example, low temperature CVD, plasma-enhanced CVD or atomic layer deposition (ALD). In another example, protective layer 113c may include or be fabricated of one or more layers of silicon-containing material or a carbon-containing material. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite).

Figure 1B:
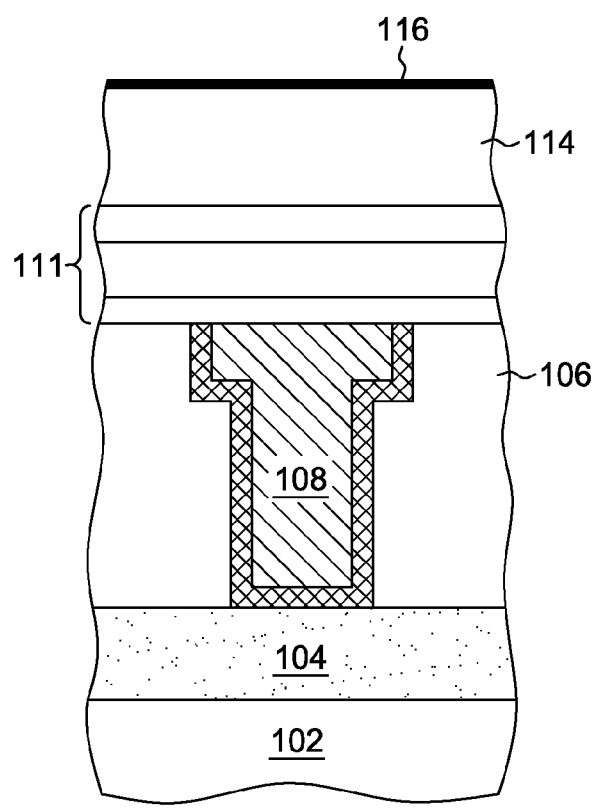

FIG. 1B illustrates the structure of FIG. 1A after providing a hard-mask layer 114 over the structure. As used herein, "hard-mask layer" refers generally to a material film or layer which overlies, for instance, the structure and may act as a protective layer for the underlying layers during the subsequent fabrication processing. In one embodiment, hard-mask layer 114, may have a thickness in the range of about 10 to 50 nanometers, and may be deposited using conventional deposition processes such as, for example, physical vapor deposition (PVD), chemical vapor deposition (CVD), pulsed CVD, plasma-enhanced CVD (PECVD), metal organic CVD (MOCVD), atomic layer deposition (ALD), plasma-enhanced ALD (PEALD). By way of example, the hard-mask layer may include or be fabricated of a nitride material such as, for example, titanium nitride (TiN), tantalum nitride (TaN), tungsten nitride (WN), titanium aluminum nitride (TiAlN) or the like. In one example, a titanium nitride (TiN) hard-mask layer may be formed using a titanium precursor such as, for example, tetrakis(dimethylamino) titanium (TDMAT) or titanium tetrachloride ($TiCl_4$) and a reagent plasma such as, for example nitrogen plasma at a process temperature of about 600° C. or less during a plasma enhanced ALD (PEALD) processing. In another example, tantalum nitride (TaN) may be formed using a tantalum precursor such as, for example pentakis(dimethylamino)tantalum (PDMAT) and a reagent plasma such as, ammonia plasma during plasma-enhanced ALD (PEALD) processing.

By way of example, a titanium nitride (TiN) hard-mask layer 114 may have a columnar grain structure with a closely-packed face-centered-cubic (fcc) crystal lattice structure. In one implementation, the titanium nitride layer with face-centered-cubic (fcc) crystal lattice structure may favor [111] crystallographic orientations, which have greater surface energy relative to other planes such as, (100), (110) etc. Note that the symbol [hkl] represents the Miller index for the set of equivalent crystal direction within a lattice, and the (hkl) represents the Miller index for the set of equivalent crystal planes. However, note that the columnar grain structure of the titanium nitride (TiN) hard-mask layer may cause the upper surface 116 to be susceptible to atmospheric oxidation upon exposure, owing to one or more voids being inherent to the titanium nitride layer. Such an oxidation results in an oxidized upper surface 116, for instance, a titanium oxynitride ($TiN_xO_y$) being formed over hard-mask layer 114. For instance, one or more atomic oxygen species of atmospheric oxygen may interact with exposed nitrogen disposed at the upper surface of the hard-mask layer forming the oxidized upper surface thereof. Note that the one or more elements of the titanium-oxygen-nitrogen disposed within oxidized upper surface 116 of hard-mask layer 114 may render the oxidized upper surface to be susceptible to undesirable thermodynamic and/or electrochemical instabilities, during subsequent fabrication processing. In one example, the one or more elements of the titanium-oxygen-nitrogen may be or include, for instance, atomic species of titanium (Ti), oxygen (O) and/or nitrogen (N). In another example, the one or more elements may also be or include, for instance, molecular species, such as molecular nitrogen ($N_2$), molecular oxygen ($O_2$), titanium nitride (TiN), and/or titanium oxide ($TiO_2$), etc.

Figure 1C:
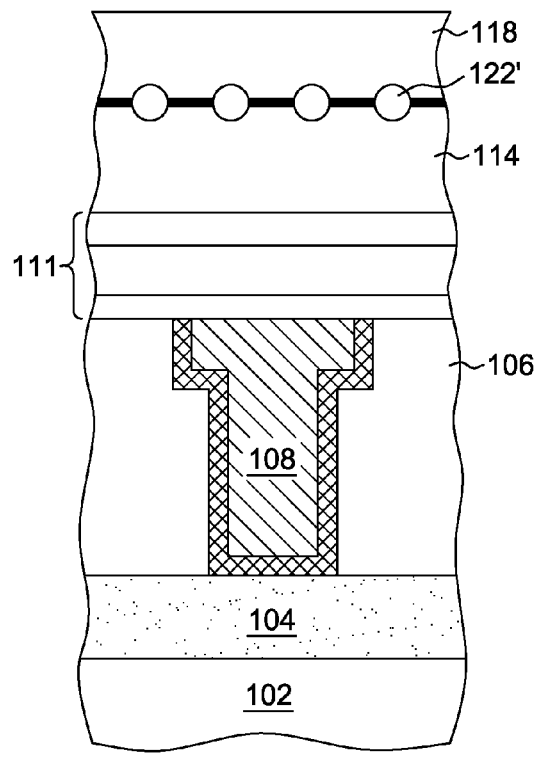

FIG. 1C illustrates the structure of FIG. 1B, after providing a dielectric layer 118 above the oxidized upper surface 116 (see FIG. 1B) of hard-mask layer 114. By way of example, dielectric layer 118 may include or be fabricated of an oxide material such as, for example, silicon dioxide (SiO$_2$), high-density plasma oxide (HDP-oxide), tetraethyl orthosilicate-oxide (TEOS-oxide) or a combination of these oxide materials. Dielectric layer 118 may be deposited using any one of several deposition techniques known in the art, such as chemical vapor deposition (CVD), low-pressure chemical vapor deposition (LPCVD), sub-atmospheric pressure CVD (SACVD), plasma-enhanced CVD (PECVD) or the like. In one example, dielectric layer 118, such as a silicon dioxide layer, may be deposited employing a silicon-containing liquid precursor and an oxygen precursor, such as, for example, ozone (O$_3$) or oxygen (O$_2$) using LPCVD, SACVD or PECVD processing. In a specific example, the silicon-containing liquid precursor may include, but not be limited to, tetraethyl orthosilicate Si(OCH$_2$CH$_3$) (commonly referred to as TEOS), tetramethoxysilane Si(OCH$_3$)$_4$ (TMOS), octamethylcyclotetrasiloxane ((CH$_3$)$_2$SiO)$_4$ (OM-CTS), hexamethyldisiloxane (HMDSO), tetramethylcyclotetrasiloxane (TMCTS), dimethyldimethoxysilane (DMD-MOS), diethoxymethylsilane (DEMS) among others.

Figure 1D:
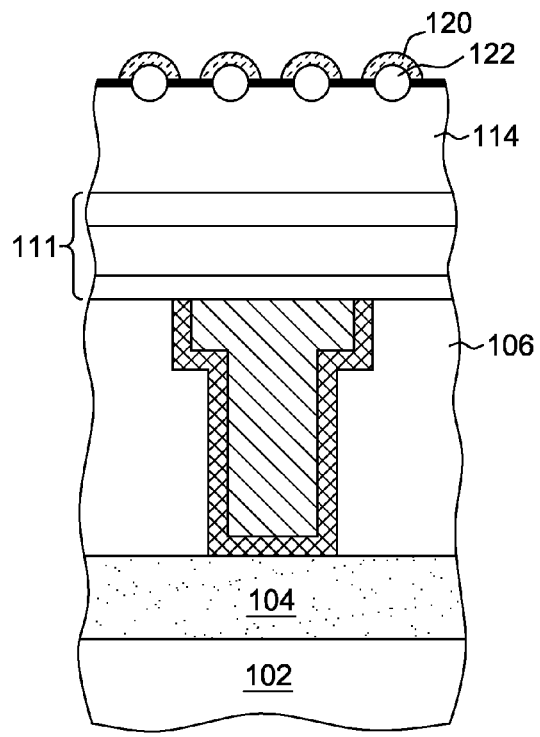

Continuing with FIG. 1C, dielectric layer 118 may be formed in a process chamber (not shown) employing, for instance, a silicon-containing liquid precursor and an oxygen-containing precursor, in the presence of one or more inert gases such as, helium (He), argon (Ar) and/or nitrogen (N$_2$). In one example, the silicon-containing liquid precursor material may be injected, for instance, into the process chamber, which may then be vaporized using a bubbler or evaporator to facilitate forming of droplets 120 of the liquid precursor over hard-mask layer 114, as depicted in FIG. 1D. The liquid precursor may subsequently be energized in the presence of plasma to form silicon (Si) ions and oxygen (O$_2$) ions. These silicon (Si) ions and oxygen ions may combine to form a layer of silicon oxide, over hard-mask layer 114. In one example, the plasma-enhanced process may be performed in the presence of a tetraethyl orthosilicate (TEOS) liquid precursor and ozone (O$_3$) gas at a temperature of about 150° C. to 500° C., with a plasma RF power of about 100 W to 1000 W. Note that the plasma-enhanced process employed to form such a silicon oxide dielectric layer 118 may utilize substantially higher temperatures compared to the deposition of hard-mask layer 114, described above.

The forming of droplets 120 of the liquid precursor over hard-mask layer 114 may cause a localized temperature difference in the range of about 50° C. to 400° C. at the interface of the hard-mask layer and liquid precursor droplet 120. Additionally, the forming of droplets 120 over hard-mask layer 114, followed by subsequent exposure to the plasma may occur with a sufficient time-lag to initiate undesirable chemical interactions between the liquid precursor and the one or more elements disposed within the oxidized upper surface of the hard-mask layer. Such localized temperature differences and/or subsequent time-lag, could disadvantageously, result in diffusion of one or more elements from the oxidized upper surface of the hard-mask layer into either the underlying hard-mask layer or the over-lying silicon-containing liquid precursor droplet, resulting in forming one or more voids 122 (see FIG. 1D) at the surfaces' interface. This, in turn, may result in forming one or more voids 122' at the interface between the resultant dielectric layer 118 and hard-mask layer 114 during and/or after the providing of dielectric layer 118, as illustrated in FIG. 1C. In one example, the one or more elements being diffused from the oxidized upper surface of the hard-mask layer may be or include, for instance, atomic species such as, atomic titanium (Ti), oxygen (O) and/or nitrogen (N). In another example, the one or more elements may also be or include, for instance, molecular species such as, molecular nitrogen (N$_2$), molecular oxygen (O$_2$), titanium nitride (TiN), and/or titanium oxide (TiO$_2$).

Continuing with FIG. 1C, these one or more voids 122' created at the interface of hard-mask layer 114 and dielectric layer 118 may exist within one or more upper layers disposed over the semiconductor layer. As integrated circuit fabrication processing transitions to sub-20 nanometers gate pitch technology, such propagation of defects could result in one or more "overlay" defects which, in turn, could result in significant performance degradation of the resultant circuit device(s).

To address these issues, disclosed herein, in one aspect, is a method for inhibiting diffusion of one or more elements between material layers, for instance, during fabricating of a layered circuit structure. The method includes, for instance: depositing a first material layer above a substrate, the first material layer including an oxidized upper surface; providing a second material layer over the oxidized upper surface of the first material layer; and inhibiting diffusion of one or more elements from the oxidized upper surface of the first material layer into either the first material layer or the second material layer during the providing of the second material layer over the oxidized upper surface of the first material layer.

Figure 2A:
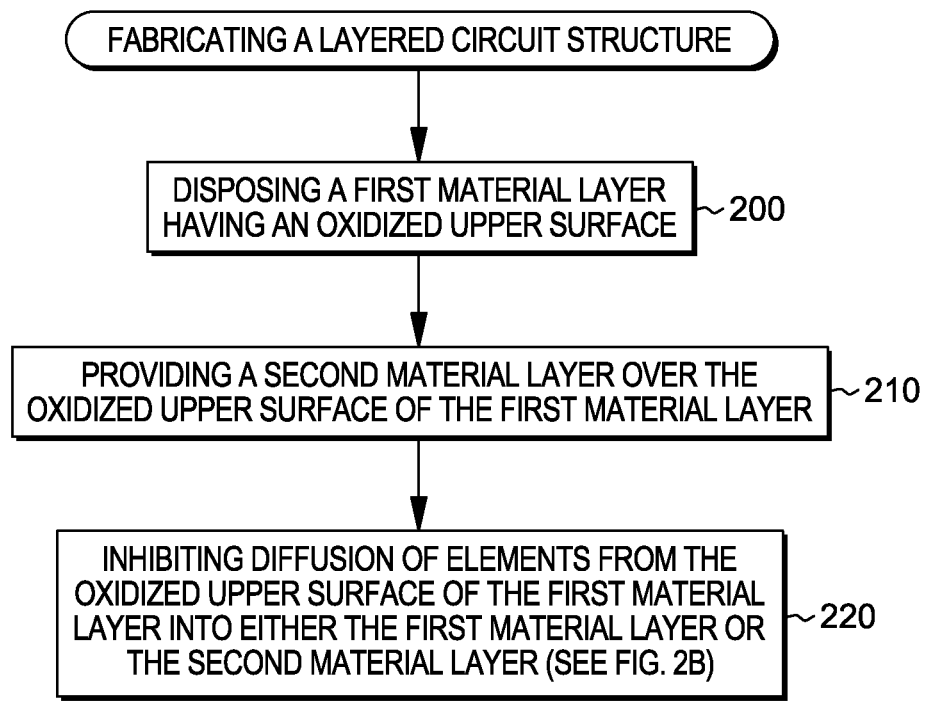
FIGS. 2A and 2B depict one embodiment of a process for inhibiting diffusion of one or more elements into a material layer or between material layers of a layered circuit structure, in accordance with one or more aspects of the present invention.
Figure 2B:
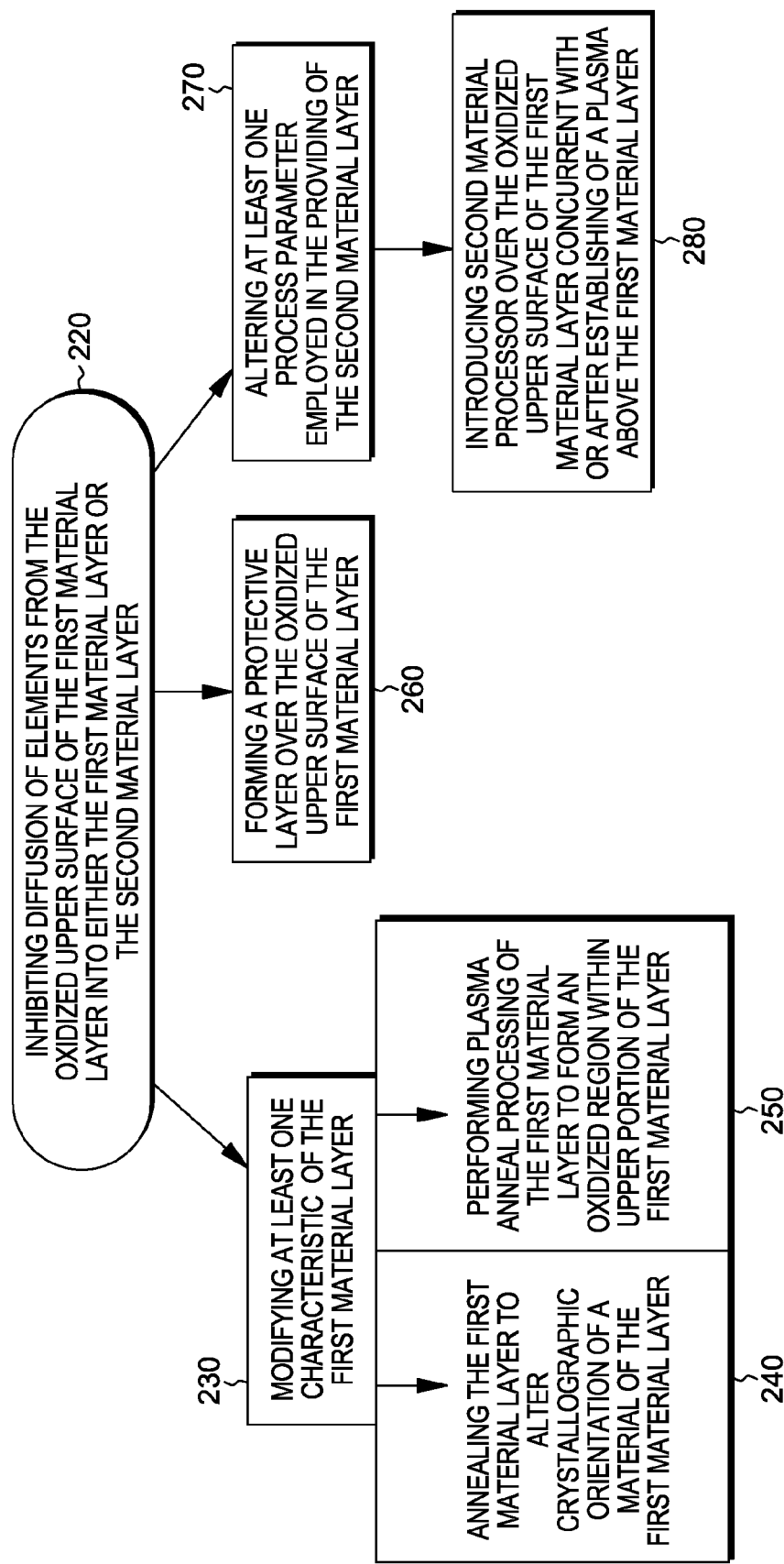

More particularly, as shown in FIGS. 2A-2B, in one embodiment, a method of fabricating a layered circuit structure (in accordance with one or more aspects of the present invention) may include depositing a first material layer having an oxidized upper surface above a substrate 200. In one example, the first material layer may include or be fabricated of a nitride material, such as a titanium nitride (TiN) layer having an oxidized upper surface such as, for instance, a titanium oxynitride (TiON) surface. The fabricating further includes providing a second material layer over the oxidized upper surface of the first material layer 210. In one example, the second material layer may include an oxide material, such as silicon dioxide (SiO$_2$). The fabricating method further includes inhibiting diffusion of one or more elements from the oxidized upper surface of the first material layer into either the first material layer or the second material layer during the providing of the second material layer over the oxidized upper surface of the first material layer 220. In one example, the one or more elements being diffused from the oxidized titanium oxynitride (TiON) surface of the first material titanium nitride (TiN) layer may be or include, for instance, atomic species such as, for example, titanium (Ti), oxygen (O) or nitrogen (N). In another example, the one or more elements may also be or include, for instance, molecular species such as, for example, titanium nitride (TiN) or titanium oxide (TiO$_2$).

In one example, the inhibiting may include modifying at least one characteristic of the first material layer, prior to the providing of the second material layer 230 (see FIG. 2B). Note that, in one embodiment, the modifying at least one characteristic of the first material layer inhibits diffusion of the one or more elements from the oxidized upper surface of the first material layer into either the first material layer or the second material layer during the providing of the second material layer over the oxidized upper surface of the first material layer. In one example, the modifying may include annealing the first material layer to, at least in part, alter crystallographic orientation of a material of the first material layer to inhibit diffusion of the one or more elements from the oxidized upper surface of the first material layer into either the first material layer or the second material layer 240. In a specific example, the altered crystallographic orientation is a non-(111) crystallographic orientation, such as, for instance, a (200) crystallographic orientation or a (220) crystallographic orientation. Further, the annealing of the first material layer may be performed, for instance, in the absence of an oxygen process gas at a temperature within a range of about 300° C. to 1250° C.

In another example, the modifying may alternatively, or also, include performing plasma anneal processing of the first material layer, in the presence of an oxygen process gas, to at least partially diffuse oxygen into the first material layer, and form an oxidized region within an upper portion of the first material layer adjacent to the oxidized upper surface thereof 250. Note that, in this example, the plasma anneal processing of the first material layer may facilitate stabilizing oxygen within the oxidized region of the first material layer, including the oxidized upper surface thereof. As one example, the plasma anneal processing of the first material layer may be performed at a temperature within a range of about 150° C. to 600° C.

In another embodiment, the inhibiting may include forming a protective layer over the oxidized upper surface of the first material layer, the protective layer facilitating inhibiting diffusion of the one or more elements from the oxidized upper surface of the first material layer into either the first material layer or the second material layer during the providing of the second material layer over the oxidized upper surface of the first material layer 260. Forming the protective layer may include forming the protective layer at a process temperature approximating a process temperature used during the depositing of the first material layer, the process temperature, for instance, being about 600° C. or less. By way of example, the protective layer over the oxidized upper surface of the first material layer may include or be fabricated of an oxide material such as, for instance, silicon oxide ($SiO_2$) and may be formed in the presence of a gaseous precursor material such as, for instance, silane ($SiH_4$) precursor. The fabricating method may further include providing the second material layer (such as, for instance, a silicon oxide ($SiO_2$) layer) over the protective layer.

In yet another embodiment, the inhibiting may include altering at least one process parameter employed in the providing of the second material layer to facilitate minimizing forming of droplets of a second material precursor over the oxidized upper surface of the first material layer during the providing of the second material layer 270. As one example, the altering at least one process parameter may include introducing the second material precursor over the oxidized upper surface of the first material layer concurrent with or after establishing of a plasma above the first material layer to facilitate minimizing forming of droplets of the second material precursor over the first material layer 290. In another example, altering at least one process parameter may alternatively, or also, include delaying introducing the second material precursor over the oxidized upper surface of the first material layer by temporarily diverting the second material precursor from a process chamber which includes the layered circuit structure. The second material precursor may be or include a liquid precursor material such as, for instance, a tetraethyl orthosilicate (TEOS) precursor material.

In one embodiment, the inhibiting may include both modifying at least one characteristic of the first material layer, prior to the providing of the second material layer, and forming a protective layer over the oxidized upper surface of the first material layer to facilitate the inhibiting diffusion of the one or more elements from the oxidized upper surface of the first material layer into either the first material layer or the second material layer during the providing of the second material layer over the oxidized upper surface of the first material layer. In another embodiment, the inhibiting may include both modifying at least one characteristic of the first material layer, prior to the providing of the second material layer, and altering at least one process parameter employed in the providing of the second material layer to facilitate the inhibiting diffusion of the one or more elements from the oxidized upper surface of the first material layer into either the first material layer or the second material layer. In yet another embodiment, the inhibiting may include both forming a protective layer over the oxidized upper surface of the first material layer, and altering at least one process parameter employed in the providing of the second material layer to facilitate the inhibiting diffusion of the one or more elements from the oxidized upper surface of the first material layer into either the first material layer or the second material layer.

FIGS. 3A-3F depict a detailed example process for inhibiting diffusion of one or more elements, for instance, between material layers of a layered circuit structure, in accordance with one or more aspects of the present invention. Advantageously, as described below, in this embodiment the diffusion of one or more elements between material layers of the layered circuit structure is inhibited by modifying at least one characteristic of the hard-mask layer prior to the providing of the overlying dielectric layer.

Figure 3A:
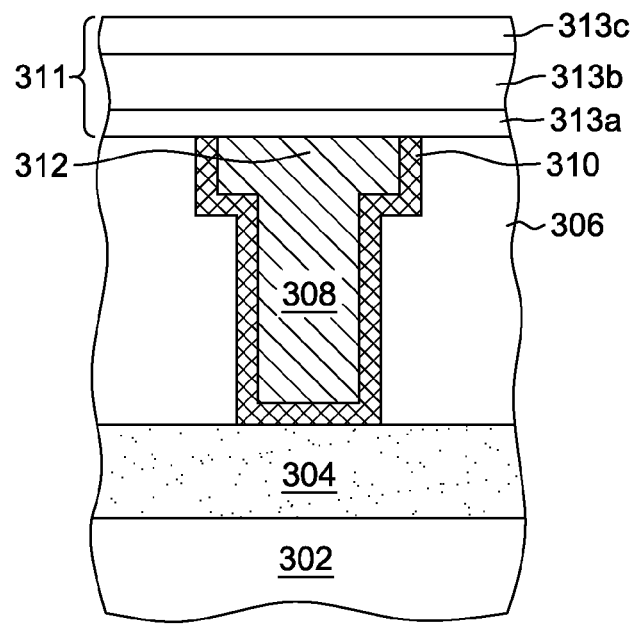
FIG. 3A is a partial cross-sectional elevational view of one embodiment of a layered circuit structure obtained during a fabrication process, in accordance with one or more aspects of the present invention.

Similar to FIG. 1A, FIG. 3A depicts one embodiment of an intermediate structure 300 obtained during fabrication of a circuit structure. In the example shown, intermediate structure 300 includes a substrate 302, such as a semiconductor substrate (for instance, a silicon substrate). As another example, substrate 302 may include any silicon-containing substrate including, but not limited to, silicon (Si), single-crystal silicon, polycrystalline Si, amorphous Si, silicon-on-nothing (SON), silicon-on-insulator (SOI) or silicon-on-replacement insulator (SRI) substrates or the like.

During front-end of line (FEOL) processing, individual devices are created, for instance, in a device layer 304 disposed over substrate 302. As only an example, these individual devices may include metal-oxide-semiconductor field-effect transistors (MOSFETs) such as FinFETs, as well as capacitors, resistors and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or partially connected) semiconductor devices may be fabricated in device layer 304.

After FEOL processing, as well as middle-of-the-line (MOL) processing, back-end of line (BEOL) processing is performed. By way of example, the BEOL processing may include, for instance, silicidation of source and drain regions, deposition of a dielectric layers, and formation of vias or trenches in the dielectric layers as metal interconnect layers. During BEOL processing, one or more dielectric layers 306 such as, for instance, pre-metal dielectric (PMD) layers, interlayer dielectric (ILD) layers and intermetal dielectric layers (IMD) may be formed above device layer 304 so as to electrically isolate the respective circuit elements or conductive structures being formed. The dielectric layer(s) 306 may include, for example, silicon oxide deposited and patterned with a network of interconnecting conductive structures (also referred to as interconnecting lines or wiring), for instance, to facilitate the desired interconnection of semiconductor devices in device layer 304 as required to implement a particular integrated circuit design. The deposition of dielectric layer(s) 306, followed by subsequent processing to pattern, etch and fill trenches and vias with, for instance, conductive structures 308, may be repeated during BEOL processing such that several metal layers, for example, six to ten metal layers, are deposited and processed in a similar manner. Between each metal layer, hard-mask layers may be formed to protect the underlying layers during the subsequent fabrication processing.

By way of example, dielectric layer 306 may be patterned using conventional etch processes, to define one or more interconnecting conductive structure(s) 308. In one example, conductive structure 308 may include one or more liners 310 deposited within the patterned openings. A liner refers generally to any film or layer which may form part of the resultant conductive structure, and include (for instance) one or more conformally-deposited layers, such as one or more layers of titanium (Ti), carbon doped titanium, tungsten (W), tungsten nitride (WN), titanium nitride (TiN), tantalum nitride (TaN), titanium aluminum nitride (TiAlN) or the like. Liners 310 may be deposited using conventional deposition processes, for example, atomic layer deposition (ALD), chemical vapor deposition (CVD) or any other suitable process, and facilitate the forming of conductive structures 308 by the subsequent filling of openings with a conductive material 312, such as a metal, for instance, copper, tungsten or the like. A non-selective chemical-mechanical polish may be employed to polish away excess liners 310 and excess conductive material 312 with the chemical-mechanical polishing terminating at, for instance, conductive structure(s) 308, resulting in the height of conductive structure 308 being substantially equal to height of dielectric layer 306 as illustrated.

Further, as noted above, one skilled in the art will note that the BEOL fabrication processing may further include a multilayer stack structure 311 being deposited over the structure. The multilayer stack structure, for instance, may include an etch-stop layer 313a, a layer of dielectric material 313b disposed above etch-stop layer 313a, and a protective hard-mask layer 313c disposed above dielectric layer 113b.

By way of example, etch-stop layer 313a, which may facilitate a subsequent etching processing, may include or be fabricated of nitrogen-doped silicon carbide (N-Blok) material and hydrogen-doped silicon carbide (Blok) material. In another example, etch-stop layer 313a may also include or be fabricated of materials such as, for example, silicon nitride (SiN), silicon carbide (SiC), silicon carbonitride (SiCN) or a combination thereof or any other suitable material, which may be chosen to be compatible with the etch chemistry and technique to be employed. Etch-stop layer 313a may have a minimum thickness such that subsequent processing including an etching process for formation of opening in layers above the etch stop, will properly stop on or at etch-stop layer 313a with enough margin for error. Etch-stop layer 313a, in one embodiment, may be deposited using conventional deposition processes such as, for instance, atomic layer deposition (ALD), chemical vapor deposition (CVD) or the plasma-enhanced versions of the same.

Continuing further with FIG. 1A, a dielectric layer 313b may be provided over etch-stop layer 313b. Although not depicted in the figures, one skilled in the art will understand that the dielectric layer may typically be patterned to define one or more interconnecting conductive structure(s). For instance, the conductive structure(s) may include one or more conductive lines, which support electrical connections along a horizontally-extending length. In another example, conductive structure(s) may also include one or more contact vias which facilitate vertical electrical connection between BEOL metal layers of an integrated circuit.

By way of example, dielectric layer 313b may be deposited from a gaseous phase using any suitable conventional deposition processes, for instance, chemical vapor deposition (CVD), physical vapor deposition (PVD), atomic layer deposition (ALD) or from a liquid phase using a spin-on deposition process. In one example, dielectric layer 313b may include or be fabricated of, for instance, silicon oxide ($SiO_2$), silicon nitride (SiN or $Si_3N_4$), fluorinated silicate glass (FSG). In another example, dielectric layer 313b may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one specific example, dielectric layer 313b may include dense or porous materials such as, for example, silicon oxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$). In another specific example, dielectric layer 313b may also include spin-on organosilicate glass material, such as sol-gel films, for example, Nanoglass, and methylsilsesquioxane materials such as, JSR5108 or JSR5109 or LKD (available from JSR), porous SILK (available from Dow Chemical, Midland, Mich.), and BLACK DIAMOND or BLACK DIAMOND II (available from Applied Materials), CORAL (available from Novellus), mesoporous organosilicate glass (OSG), divinyl-siloxane bisbenzocyclobutene (BCB) or other organo dielectric materials having silicon-carbon-oxygen-hydrogen (Si-COH) composition.

Additionally, protective hard-mask layer 313c, which may be used to protect underlying structure during subsequent fabrication, may be provided over dielectric layer 313b. Protective layer 313c, in one specific example, may include or be fabricated of a nitride such as, for example, silicon nitride (SiN or $Si_3N_4$). The deposition process may include any conventional process such as, for example, low temperature CVD, plasma-enhanced CVD or atomic layer deposition (ALD). In another example, protective layer 313c may include or be fabricated of one or more layers of silicon-containing material or a carbon-containing material. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite).

Figure 3B:
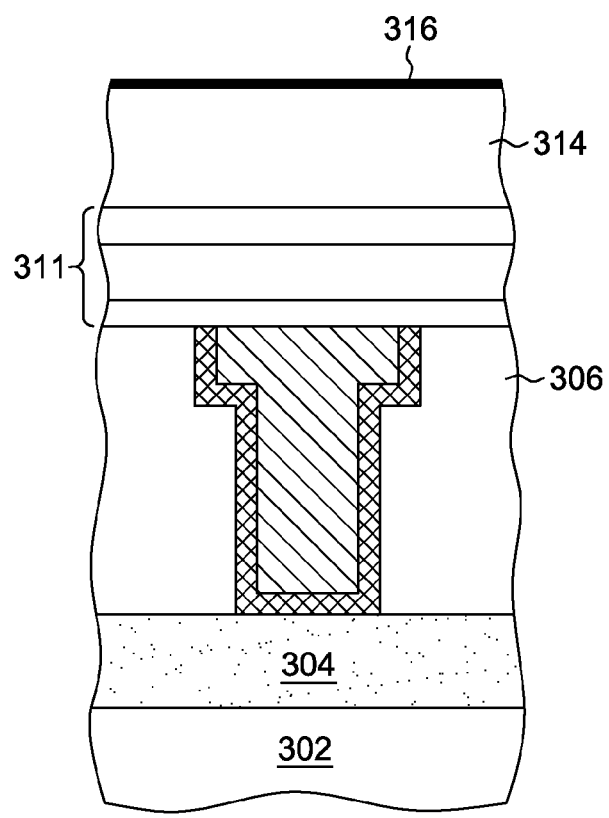
FIG. 3B depicts the structure of FIG. 3A after depositing a hard-mask layer having an oxidized upper surface, in accordance with one or more aspects of the present invention.

FIG. 3B illustrates the structure of FIG. 3A after providing a hard-mask layer 314 over the structure. As used herein, "hard-mask layer" refers generally to a material film or layer which overlies, for instance, the structure and may act as a protective layer for the underlying layers during the subsequent fabrication processing. In one embodiment, hard-mask layer 314, may have a thickness in the range of about 10 to 50 nanometers, and may be deposited using conventional deposition processes such as, for example, physical vapor deposition (PVD), chemical vapor deposition (CVD), pulsed CVD, plasma-enhanced CVD (PECVD), metal organic CVD (MOCVD), atomic layer deposition (ALD), plasma-enhanced ALD (PEALD). By way of example, the hard-mask layer may include or be fabricated of a nitride material such as, for example, titanium nitride (TiN), tantalum nitride (TaN), tungsten nitride (WN), titanium aluminum nitride (TiAlN) or the like. In one example, a titanium nitride (TiN) may be formed using a titanium precursor such as, for example, tetrakis(dimethylamino) titanium (TDMAT) or titanium tetrachloride (TiCl$_4$) and a reagent plasma such as, for example nitrogen plasma, at a process temperature of about 600° C. or less during a plasma enhanced ALD (PEALD) processing. In another example, tantalum nitride (TaN) may be formed using a tantalum precursor such as, for example pentakis(dimethylamino)tantalum (PDMAT) and a reagent plasma such as, ammonia plasma during plasma-enhanced ALD (PEALD) processing.

By way of example, a titanium nitride (TiN) hard-mask layer 314 may have a columnar grain structure with a closely-packed face-centered-cubic (fcc) crystal lattice structure. In one example, the titanium nitride layer with face-centered-cubic (fcc) crystal lattice structure may favor [111] crystallographic orientations, which have greater surface energy relative to other planes such as, (100), (110) etc. Note that the symbol [hkl] represents the Miller index for the set of equivalent crystal direction within a lattice, and the (hkl) represents the Miller index for the set of equivalent crystal planes. However, note that the columnar grain structure of the titanium nitride (TiN) hard-mask layer may cause the upper surface 316 to be susceptible to atmospheric oxidation upon exposure, owing to one or more voids being inherent to the titanium nitride layer. Such an oxidation results in an oxidized upper surface 316, for instance, a titanium oxynitride (TiN$_x$O$_y$) being formed over hard-mask layer 314. For instance, one or more atomic oxygen species of atmospheric oxygen may interact with exposed nitrogen disposed at the upper surface of the hard-mask layer forming the oxidized upper surface thereof. Note that the one or more elements of the titanium-oxygen-nitrogen disposed within oxidized upper surface 316 of hard-mask layer 314 may render the oxidized upper surface to be susceptible to undesirable thermodynamic and/or electrochemical instabilities, during subsequent fabrication processing. In one example, the one or more elements of the titanium-oxygen-nitrogen may be or include, for instance, atomic species of titanium (Ti), oxygen (O) and/or nitrogen (N). In another example, the one or more elements may also be or include, for instance, molecular species such as, molecular nitrogen (N$_2$), molecular oxygen (O$_2$), titanium nitride (TiN) and/or titanium oxide (TiO$_2$), etc.

Figure 3C:
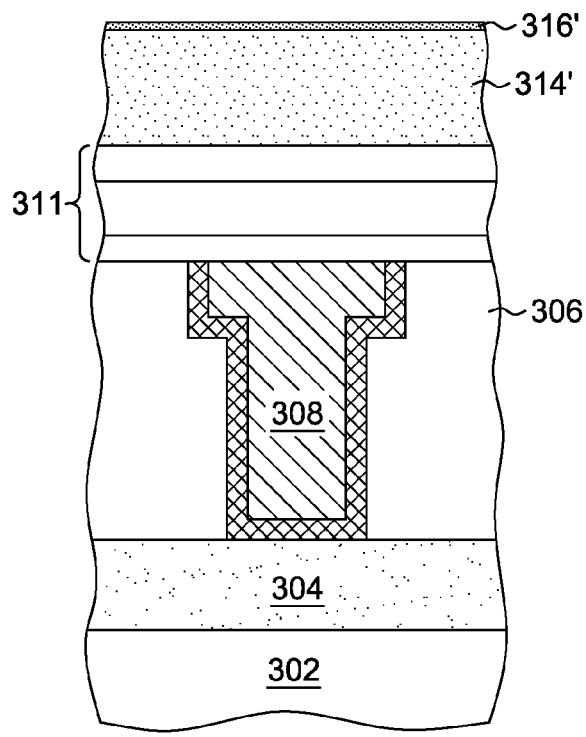
FIG. 3C depicts the structure of FIG. 3B after annealing, to alter crystallographic orientation of material of the hard-mask layer, in accordance with one or more aspects of the present invention.

In this embodiment, the fabricating process includes inhibiting diffusion of one or more elements of the titanium-oxygen-nitrogen disposed within oxidized upper surface 316 of hard-mask layer 314 by, for instance, modifying at least one characteristic of the hard-mask layer. By way of example, modifying of the at least one characteristic of the hard-mask layer may include, for instance, altering the crystallographic orientation of the hard-mask layer. In one example, the structure may be subjected, for instance, to one or more annealing processes to, at least in part, alter crystallographic orientation of a material of the hard-mask layer. For instance, the annealing process may be performed in the absence of an oxygen process gas, for instance, in a rapid thermal annealing (RTA) chamber, at a temperature in the range of about 300° C. to 1250° C. for about 3 to 30 mins. The annealing process is designated to advantageously facilitate reducing or minimizing interstitial energies inherent to titanium nitride material of the hard-mask layer which, in turn, facilitates lowering the surface energy of the hard-mask layer. Note that, in this example, the surface energy of the hard-mask layer may be lowered, for instance, by altering the crystallographic orientation of the hard-mask layer 314. In one example, the crystallographic orientation of the hard-mask layer may be altered to a non-(111) crystallographic orientation such as, for instance, a (200) crystallographic orientation and/or (220) crystallographic orientation within the resultant hard-mask layer 314', as depicted in FIG. 3C. Note that one skilled in the art will understand that (200) crystallographic orientation and/or (220) crystallographic orientation have substantially lower surface energy compared to (111) crystallographic orientation due to the respective local bonding environments. Note that, in one example, the annealing processing of the hard-mask layer advantageously facilitates altering the crystallographic orientation of the hard-mask layer along with the crystallographic orientation of the oxidized upper surface 316' thereof.

Figure 3D:
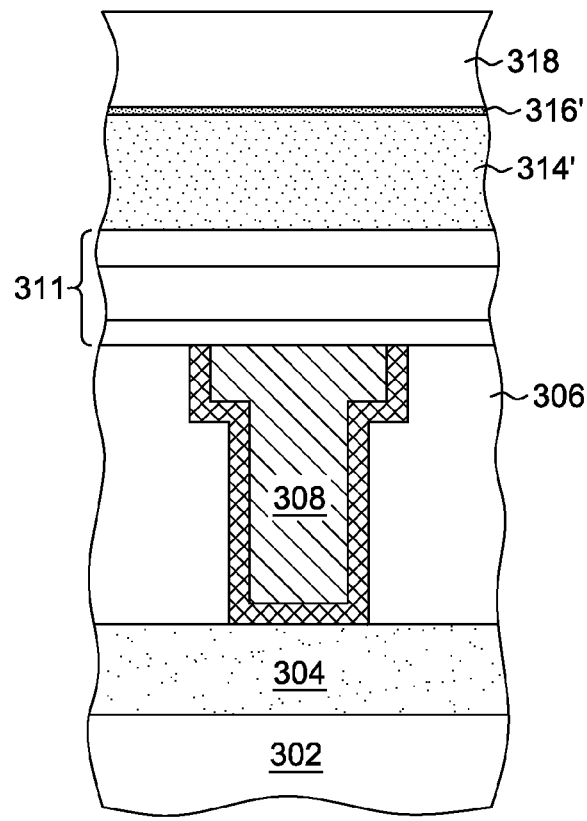
FIG. 3D depicts the structure of FIG. 3C with a dielectric layer having been provided over the hard-mask layer having an altered crystallographic orientation, in accordance with one or more aspects of the present invention.

FIG. 3D depicts the structure of FIG. 3C with a dielectric layer 318 having been provided over hard-mask layer 314' of altered crystallographic orientation, in accordance with one or more aspects of the present invention. By way of example, dielectric layer 318 may include or be fabricated of an oxide material such as, for example, silicon dioxide (SiO$_2$), high-density plasma oxide (HDP-oxide), tetraethyl orthosilicate-oxide (TEOS-oxide) or a combination of these oxide materials. Dielectric layer 318 may be deposited using any one of several deposition techniques known in the art, such as chemical vapor deposition (CVD), low-pressure chemical vapor deposition (LPCVD), sub-atmospheric pressure CVD (SACVD), plasma-enhanced CVD (PECVD) or the like. In one example, dielectric layer 318 such as a silicon dioxide layer, may be deposited employing a silicon-containing liquid precursor and an oxygen precursor, such as, for example, ozone (O$_3$) or oxygen (O$_2$) using LPCVD, SACVD or PECVD processing. In a specific example, the silicon-containing liquid precursor may include, but not limited to, tetraethyl orthosilicate Si(OCH$_2$CH$_3$) (commonly referred to as TEOS), tetramethoxysilane Si(OCH$_3$)$_4$ (TMOS), octamethylcyclotetrasiloxane ((CH$_3$)$_2$SiO)$_4$ (OMCTS), hexamethyldisiloxane (HMDSO), tetramethylcyclo-tetrasiloxane (TMCTS), dimethyldimethoxysilane (DMDMOS), diethoxymethylsilane (DEMS) among others.

Dielectric layer 318 may be formed in a process chamber (not shown) employing, for instance, a silicon-containing liquid precursor and an oxygen-containing precursor, in the presence of one or more inert gases such as, helium (He), argon (Ar) and/or nitrogen (N$_2$). The liquid precursor may subsequently be energized in the presence of plasma to form silicon (Si) ions and oxygen (O$_2$) ions. These silicon (Si) ions and oxygen ions may combine to form a layer of silicon oxide, over hard-mask layer 314'. In one example, the plasma-enhanced process may be performed in the presence of tetraethyl orthosilicate (TEOS) liquid precursor and ozone (O$_3$) gas at a temperature of about 150° C. to 500° C., with a plasma RF power of about 100 to 1000 W. Note that in this example, as noted above, the altered crystalline orientation, for instance, (200) crystallographic orientation and/or (220) crystallographic orientation of hard-mask layer 314' facilitates in lowering of the surface energy of hard-mask layer 314' which, in turn, facilitates inhibiting diffusion of one or more elements from the oxidized upper surface of the hard-mask layer into either the underlying hard-mask layer 314' or the overlying dielectric layer 318.

Figure 3E:
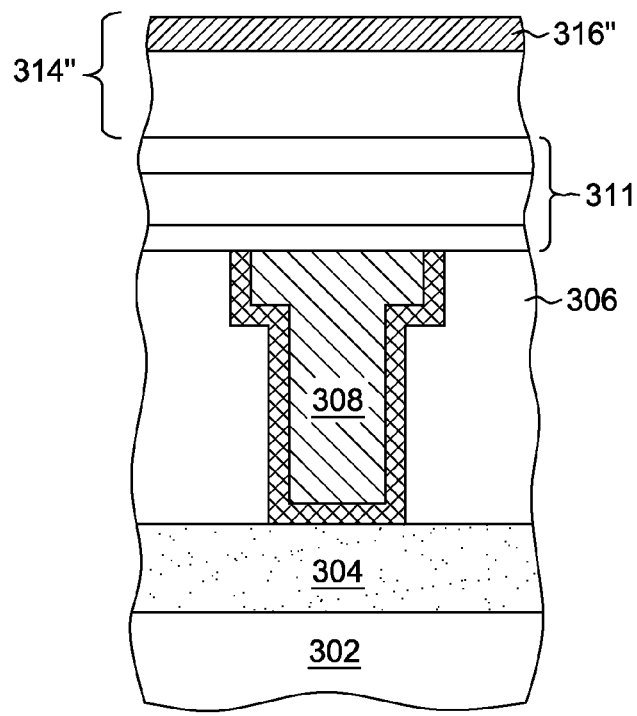
FIG. 3E depicts the structure of FIG. 3B after plasma anneal processing to form an oxidized region of the hard-mask layer, in accordance with one or more aspects of the present invention

In addition, or as an alternate process, diffusion of one or more elements of the titanium-oxygen-nitrogen disposed within oxidized upper surface 316 of the hard-mask layer may be inhibited, for instance, by modifying at least one characteristic of the hard-mask layer through forming an oxidized region 316" within an upper portion of the hard-mask layer. In this example, the structure may be subjected, for instance, to a plasma anneal processing in the presence of an oxygen process gas. As shown in FIG. 3E, in one embodiment, this plasma anneal processing facilitates at least partially diffusing oxygen from the oxidized upper surface of the hard-mask layer into the hard-mask layer lattice, for instance, a titanium nitride (TiN) lattice, resulting in replacing the nitrogen atomic species within the upper portion of the hard-mask layer with the atomic oxygen species. This diffusion of oxygen advantageously converts a portion of the hard-mask layer to oxidized region 316" within the upper portion of the hard-mask layer, resulting in a diffusion controlled oxidation of the hard-mask layer to form hard-mask layer 314". As one specific example, the upper portion of hard-mask layer such as titanium nitride (TiN) may be converted to titanium oxynitride (TiON), resulting in a titanium oxynitrided (TiON) region 316" of hard-mask layer 314". The oxidized region 316" within the upper portion of hard-mask layer 314" may have a thickness in a range of about 1 to 10 nm. In one example, the plasma anneal processing of the hard-mask layer may be performed at a temperature within a range of about 150° C. to 600° C. Note that, in this example, the plasma anneal processing of the hard-mask layer advantageously facilitates stabilizing one or more elements such as, for instance, molecular oxygen within oxidized region 316" of hard-mask layer 314", along with the upper surface thereof.

Figure 3F:
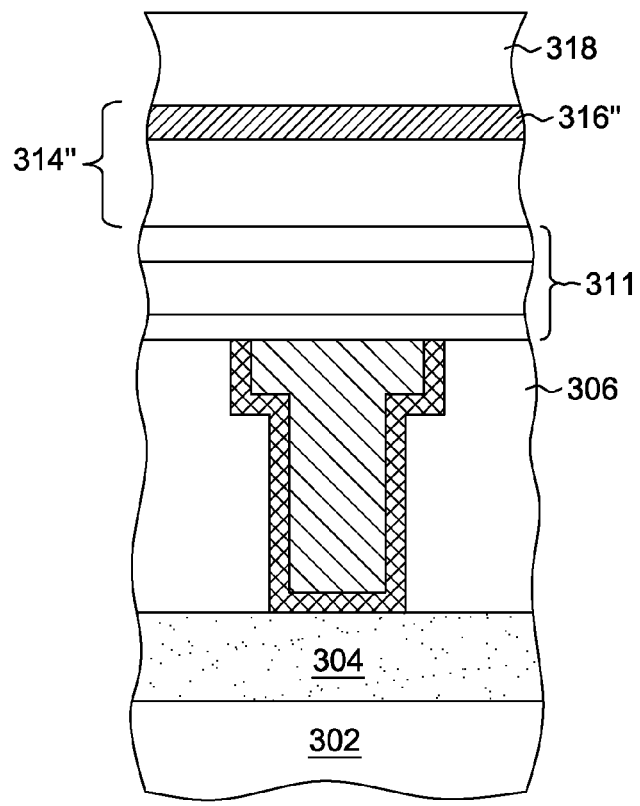
FIG. 3F depicts the structure of FIG. 3E with a dielectric layer having been provided over the oxidized region of the hard-mask layer, in accordance with one or more aspects of the present invention.

Dielectric layer 318 may also be provided over the oxidized region hard-mask layer, for instance, over the oxidized region 316" of hard-mask layer 314", as depicted in FIG. 3F. Note that as described above, the plasma anneal processing of the hard-mask layer has stabilized the one or more elements disposed within the oxidized region of the hard-mask layer which, in turn advantageously facilitates in reducing or minimizing undesirable thermodynamic and/or electrochemical instabilities, thereby inhibiting diffusion of one or more elements from the oxidized region 316" of the hard-mask layer.

FIGS. 4A-4D depict another example of an enhanced method for inhibiting diffusion of one or more elements, for instance, between material layers of a layered circuit structure, in accordance with one or more aspects of the present invention. Advantageously, as described below, in this embodiment, the diffusion of one or more elements between material layers of a layered circuit structure may be inhibited, for instance, by forming a protective layer over the oxidized upper surface of the hard-mask layer, prior to the providing of the dielectric layer.

Figure 4A:
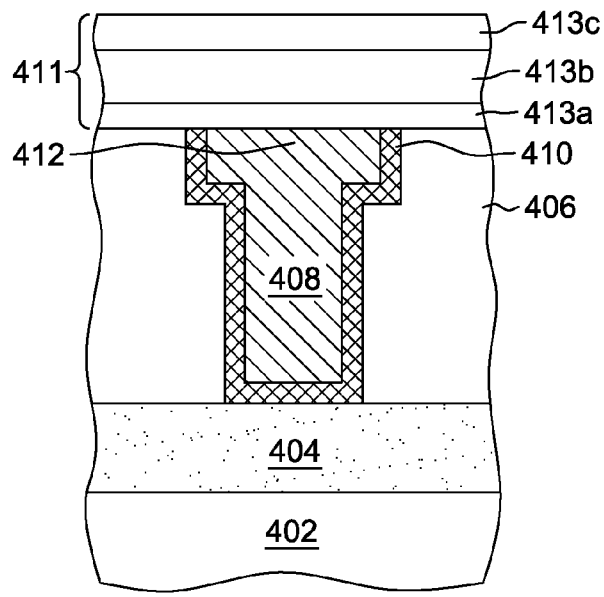
FIG. 4A is a partial cross-sectional elevational view of one embodiment of a layered circuit structure obtained during a fabrication process, in accordance with one or more aspects of the present invention.

FIG. 4A depicts one embodiment of an intermediate structure 400 obtained during fabrication of a layered circuit structure. In the example shown, intermediate structure 400 includes a substrate 402, such as a semiconductor substrate (for instance, a silicon substrate). As another example, substrate 402 may include any silicon-containing substrate including, but not limited to, silicon (Si), single-crystal silicon, polycrystalline Si, amorphous Si, silicon-on-nothing (SON), silicon-on-insulator (SOI) or silicon-on-replacement insulator (SRI) substrates or the like.

During front-end of line (FEOL) processing, individual devices are created, for instance, in a device layer 404 disposed over substrate 402. As only an example, these individual devices may include metal-oxide-semiconductor field-effect transistors (MOSFETs) such as FinFETs, as well as capacitors, resistors and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or partially connected) semiconductor devices may be fabricated in device layer 404.

After FEOL processing, as well as middle-of-the-line (MOL) processing, back-end of line (BEOL) processing is performed. By way of example, the BEOL processing may include, for instance, silicidation of source and drain regions, deposition of a dielectric layers, and formation of vias and/or trenches in the dielectric layers as metal interconnect layers. During BEOL processing, one or more dielectric layers 406 such as, for instance, pre-metal dielectric (PMD) layers, interlayer dielectric (ILD) layers and intermetal dielectric layers (IMD) may be formed above device layer 404 so as to electrically isolate the respective circuit elements or conductive structures being formed. The dielectric layer(s) 406 may include, for example, silicon oxide deposited and patterned with a network of interconnecting conductive structures (also referred to as interconnecting lines or wiring), for instance, to facilitate the desired interconnection of semiconductor devices in device layer 404 as required to implement a particular integrated circuit design. The deposition of dielectric layer(s) 406, followed by subsequent processing to pattern, etch and fill trenches and vias with, for instance, conductive structures 408, may be repeated during BEOL processing such that several metal layers, for example, six to ten metal layers, are deposited and processed in a similar manner. Between each metal layer, hard-mask layers may be formed to protect the underlying layers during the subsequent fabrication processing.

By way of example, dielectric layer 406 may be patterned, using conventional etch processes, to define one or more interconnecting conductive structure(s) 408. In one example, conductive structure 408 may include one or more liners 410 deposited within the patterned openings. A liner refers generally to any film or layer which may form part of the resultant conductive structure, and include (for instance) one or more conformally-deposited layers, such as one or more layers of titanium (Ti), carbon doped titanium, tungsten (W), tungsten nitride (WN), titanium nitride (TiN), tantalum nitride (TaN), titanium aluminum nitride (TiAlN) or the like. Liners 310 may be deposited using conventional deposition processes, for example, atomic layer deposition (ALD), chemical vapor deposition (CVD) or any other suitable process, and facilitate the forming of conductive structures 408 by the subsequent filling of openings with a conductive material 412, such as a metal, for instance, copper, tungsten or the like. A non-selective chemical-mechanical polish may be employed to polish away excess liners 410 and excess conductive material 412 with the chemical-mechanical polishing terminating at, for instance, conductive structure(s) 408, resulting in the height of conductive structure 408 being substantially equal to height of dielectric layer 406 as illustrated.

Further, as noted above, one skilled in the art will note that the BEOL fabrication processing may further include a multilayer stack structure 411 being deposited over the structure. The multilayer stack structure, for instance, may include an etch-stop layer 413a, a layer of dielectric material 413b disposed above etch-stop layer 413a, and a protective hard-mask layer 413c disposed above dielectric layer 413b.

By way of example, etch-stop layer 413a, which may facilitate a subsequent etching processing, may include or be fabricated of nitrogen-doped silicon carbide (N-Blok) material and hydrogen-doped silicon carbide (Blok) material. In another example, etch-stop layer 413a may also include or be fabricated of materials such as, for example, silicon nitride (SiN), silicon carbide (SiC), silicon carbonitride (SiCN) or a combination thereof or any other suitable material, which may be chosen to be compatible with the etch chemistry and technique to be employed. Etch-stop layer 413a may have a minimum thickness such that subsequent processing including an etching process for formation of opening in layers above the etch stop, will properly stop on or at etch-stop layer 413a with enough margin for error. Etch-stop layer 413a, in one embodiment, may be deposited using conventional deposition processes such as, for instance, atomic layer deposition (ALD), chemical vapor deposition (CVD) or the plasma-enhanced versions of the same.

Continuing further with FIG. 1A, a dielectric layer 413b may be provided over etch-stop layer 413b. Although not depicted in the figures, one skilled in the art will understand that the dielectric layer may typically be patterned to define one or more interconnecting conductive structure(s). For instance, the conductive structure(s) may include one or more conductive lines, which support electrical connections along a horizontally-extending length. In another example, conductive structure(s) may also include one or more contact vias which facilitate vertical electrical connection between BEOL metal layers of an integrated circuit.

By way of example, dielectric layer 413b may be deposited from a gaseous phase using any suitable conventional deposition processes, for instance, chemical vapor deposition (CVD), physical vapor deposition (PVD), atomic layer deposition (ALD) or from a liquid phase using a spin-on deposition process. In one example, dielectric layer 413b may include or be fabricated of, for instance, silicon oxide ($SiO_2$), silicon nitride (SiN or $Si_3N_4$), fluorinated silicate glass (FSG). In another example, dielectric layer 413b may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one specific example, dielectric layer 413b may include dense or porous materials such as, for example, silicon oxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$). In another specific example, dielectric layer 413b may also include spin-on organosilicate glass material, such as sol-gel films, for example, Nanoglass, and methylsilsesquioxane materials such as, JSR5108 or JSR5109 or LKD (available from JSR), porous SILK (available from Dow Chemical, Midland, Mich.), and BLACK DIAMOND or BLACK DIAMOND II (available from Applied Materials), CORAL (available from Novellus), mesoporous organosilicate glass (OSG), divinylsiloxane bisbenzocyclobutene (BCB) or other organo dielectric materials having silicon-carbon-oxygen-hydrogen (Si-COH) composition.

Additionally, protective hard-mask layer 413c, which may be used to protect underlying structure during subsequent fabrication, may be provided over dielectric layer 413b. Protective layer 413c, in one specific example, may include or be fabricated of a nitride such as, for example, silicon nitride (SiN or $Si_3N_4$). The deposition process may include any conventional process such as, for example, low temperature CVD, plasma-enhanced CVD or atomic layer deposition (ALD). In another example, protective layer 413c may include or be fabricated of one or more layers of silicon-containing material or a carbon-containing material. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite).

Figure 4B:
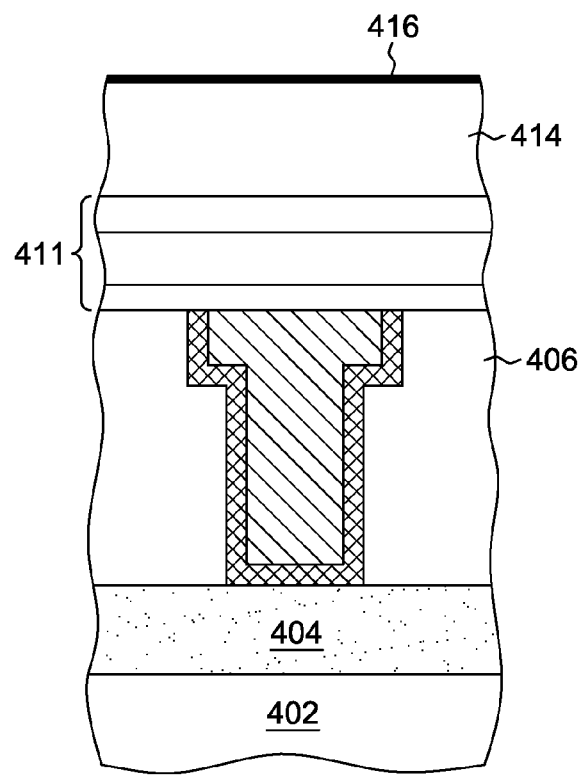
FIG. 4B depicts the structure of FIG. 4A after depositing a hard-mask layer having an oxidized upper surface, in accordance with one or more aspects of the present invention.

FIG. 4B illustrates the structure of FIG. 4A after providing a hard-mask layer 414 over the structure. As used herein, "hard-mask layer" refers generally to a material film or layer which overlies, for instance, the structure and may act as a protective layer for the underlying layers during the subsequent fabrication processing. In one embodiment, hard-mask layer 414, may have a thickness in the range of about 10 to 50 nanometers, and may be deposited using conventional deposition processes such as, for example, physical vapor deposition (PVD), chemical vapor deposition (CVD), pulsed CVD, plasma-enhanced CVD (PECVD), metal organic CVD (MOCVD), atomic layer deposition (ALD), plasma-enhanced ALD (PEALD). By way of example, the hard-mask layer may include or be fabricated of a nitride material such as, for example, titanium nitride (TiN), tantalum nitride (TaN), tungsten nitride (WN), titanium aluminum nitride (TiAlN) or the like. In one example, a titanium nitride (TiN) may be formed using a titanium precursor such as, for example, tetrakis(dimethylamino) titanium (TDMAT) or titanium tetrachloride ($TiCl_4$) and a reagent plasma such as, for example nitrogen plasma at a process temperature of about 600° C. or less during a plasma enhanced ALD (PEALD) processing. In another example, tantalum nitride (TaN) may be formed using a tantalum precursor such as, for example pentakis(dimethylamino)tantalum (PDMAT) and a reagent plasma such as, ammonia plasma during plasma-enhanced ALD (PEALD) processing.

By way of example, a titanium nitride (TiN) hard-mask layer 414 may have a columnar grain structure with a closely-packed face-centered-cubic (fcc) crystal lattice structure. In one implementation, the titanium nitride layer with face-centered-cubic (fcc) crystal lattice structure may favor [111] crystallographic orientations, which have greater surface energy relative to other planes such as, (100), (110) etc. Note that the symbol [hkl] represents the Miller index for the set of equivalent crystal direction within a lattice, and the (hkl) represents the Miller index for the set of equivalent crystal planes. However, note that the columnar grain structure of the titanium nitride (TiN) hard-mask layer may cause the upper surface 416 to be susceptible to atmospheric oxidation upon exposure, owing to one or more voids being inherent to the titanium nitride layer. Such an oxidation results in an oxidized upper surface 416, for instance, a titanium oxynitride ($TiN_xO_y$) being formed over hard-mask layer 414. For instance, one or more atomic oxygen species of atmospheric oxygen may interact with exposed nitrogen disposed at the upper surface of the hard-mask layer forming the oxidized upper surface thereof. Note that the one or more elements of the titanium-oxygen-nitrogen disposed within oxidized upper surface 416 of hard-mask layer 414 may render the oxidized upper surface to be susceptible to undesirable thermodynamic and/or electrochemical instabilities, during subsequent fabrication processing. In one example, the one or more elements of the titanium-oxygen-nitrogen may be or include, for instance, atomic species of titanium (Ti), oxygen (O) and/or nitrogen (N). In another example, the one or more elements may also be or include, for instance, molecular species, such as molecular nitrogen ($N_2$), molecular oxygen ($O_2$), titanium nitride (TiN) and/or titanium oxide ($TiO_2$), etc.

Figure 4C:
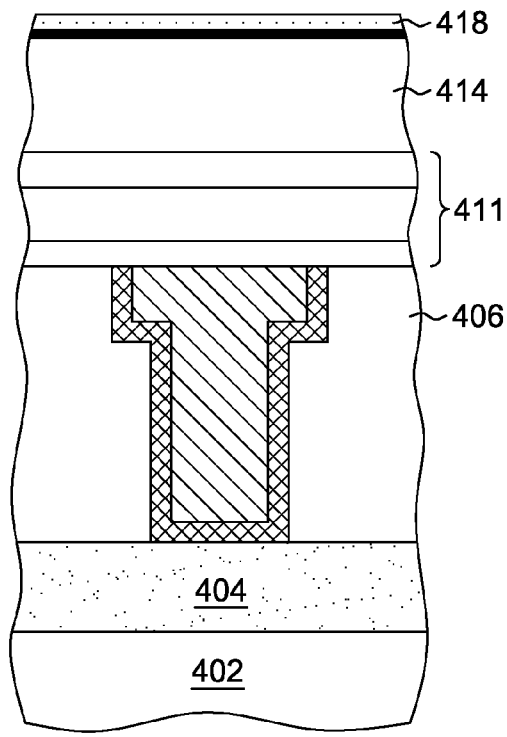
FIG. 4C depicts the structure of FIG. 4B with a protective layer having been formed over the hard-mask layer, in accordance with one or more aspects of the present invention.

FIG. 4C depicts the structure of FIG. 4B with protective layer 418 having been formed over hard-mask layer 414, in accordance with one or more aspects of the present invention. By way of example, protective layer 418 may be conformally deposited using a variety of techniques such as, for example, chemical vapor deposition (CVD), atomic vapor deposition (ALD) processes or plasma-enhanced versions of such processes. In one example, the protective layer, may have a thickness in the range of about 3 to 30 nm, and may be or include an oxide material such as, for instance, silicon oxide ($SiO_2$), plasma-enhanced silicon oxide.

In one embodiment, protective layer 418 is formed in a plasma chamber employing a process gaseous mixture including, for instance, a silane precursor and at least one gaseous material, in the presence of one or more inert gases such as, helium (He), or argon (Ar). By way of example, the protective layer may be deposited using a silane precursor such as, silane ($SiH_4$) gas and a nitrous oxide ($N_2O$) gas in a plasma chamber, during which silane ($SiH_4$) molecules and nitrous oxide ($N_2O$) molecules may be energized into a plasma to form silicon (Si) ions and oxygen ($O_2$) ions. These silicon (Si) ions and oxygen ($O_2$) ions may combine to form a layer of plasma-enhanced silicon oxide ($SiO_2$) over hard-mask layer 414. Note that, in this embodiment, protective layer 418 may be formed at a process temperature approximating a process temperature used during the depositing of hard-mask layer 414. In one example, the plasma-enhanced process may be performed in the presence of silane ($SiH_4$) gas and nitrous oxide gas ($N_2O$), at a temperature of about 500° C. or less, with a plasma RF power of about 100 to 1000 W. Note that, as discussed above, this temperature range may be substantially equal to or less than the temperature range employed in the deposition of hard-mask layer 414. Additionally, note that this temperature uniformity during the deposition processes advantageously facilitates minimizing or stabilizing any undesirable thermodynamic and/or electrochemical instabilities inherent to oxidized upper surface of hard-mask layer 414, thereby inhibiting diffusion of one or more elements from the oxidized upper surface of the hard-mask layer.

Figure 4D:
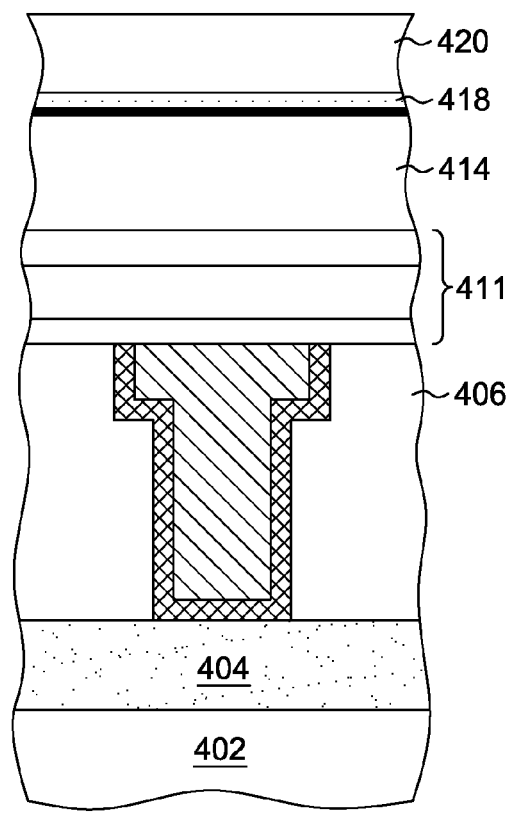
FIG. 4D depicts the structure of FIG. 4C with a dielectric layer having been provided over the protective layer, in accordance with one or more aspects of the present invention.

FIG. 4D depicts the structure of FIG. 4C with dielectric layer 420 having been provided over protective layer 418, in accordance with one or more aspects of the present invention. By way of example, dielectric layer 420 may include or be fabricated of an oxide material such as, for example, silicon dioxide ($SiO_2$), high-density plasma oxide (HDP-oxide), tetraethyl orthosilicate-oxide (TEOS-oxide) or a combination of these commonly used oxide materials. Dielectric layer 420 may be deposited using any one of the several deposition techniques well known in the art, such as chemical vapor deposition (CVD), low-pressure chemical vapor deposition (LPCVD), sub-atmospheric pressure CVD (SACVD), plasma-enhanced CVD (PECVD) or the like. In one example, dielectric layer 420 such as silicon dioxide, may be deposited employing silicon-containing liquid precursor and an oxygen precursor such as, for example, ozone ($O_3$) or oxygen ($O_2$) using LPCVD, SACVD or PECVD processes. In a specific example, the silicon-containing liquid precursor may include, but be not limited to, tetraethyl orthosilicate $Si(OCH_2CH_3)$ (commonly referred to as TEOS), tetramethoxysilane $Si(OCH_3)_4$ (TMOS), octamethylcyclotetrasiloxane $((CH_3)_2SiO)_4$ (OMCTS), hexamethyldisiloxane (HMDSO), tetramethylcyclotetrasiloxane (TM-CTS), dimethyldimethoxysilane (DMDMOS), diethoxymethylsilane (DEMS) among others.

Continuing with FIG. 4D, dielectric layer 420 may be formed in a process chamber (not shown) employing, for instance, silicon-containing liquid precursor and an oxygen-containing precursor, in the presence of one or more inert gases such as, helium (He), argon (Ar) and/or nitrogen ($N_2$). In one example, the silicon-containing liquid precursor material may be injected, for instance, into a process chamber, which may then be vaporized using a bubbler or evaporator, facilitating forming droplets of the liquid precursor over protective layer 418. Note that, in this embodiment, protective layer 418 may act as a barrier layer between the droplets of the liquid precursor material and the hard-mask layer, thereby preventing or inhibiting undesirable chemical interactions between the droplets of the liquid precursor material and the oxidized upper surface of the hard-mask layer. The liquid precursor may subsequently be energized in the presence of plasma to form silicon (Si) ions and oxygen ($O_2$) ions. These silicon (Si) ions and oxygen ions may combine to form a layer of silicon oxide, over protective layer 418. In one example, the plasma-enhanced process may be performed in the presence of tetraethyl orthosilicate (TEOS) liquid precursor and ozone ($O_3$) gas at a temperature of about 150° C. to 500° C., with a plasma RF power of about 100 W to 1000 W.

Figure 5A:
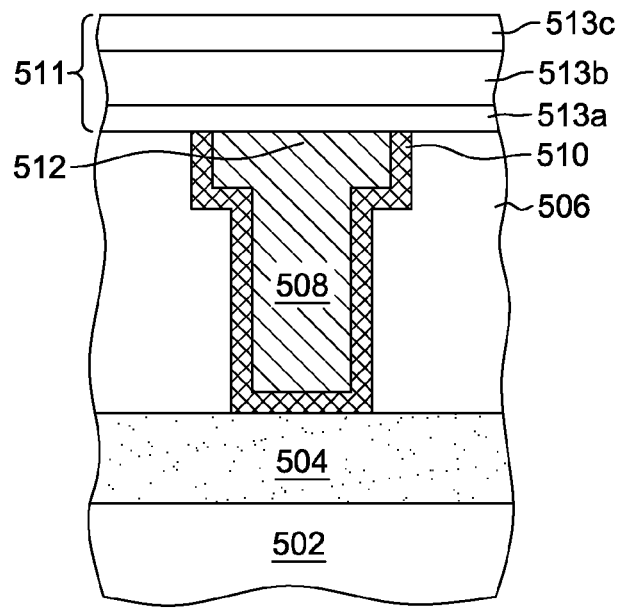
FIG. 5A is a partial cross-sectional elevational view of one embodiment of a layered circuit structure obtained during a fabrication process, in accordance with one or more aspects of the present invention.
Figure 5B:
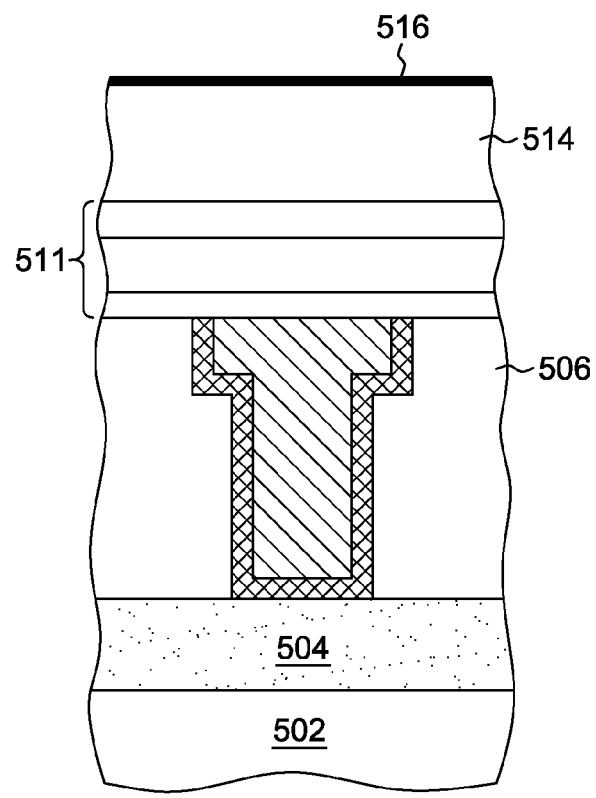
FIG. 5B depicts the structure of FIG. 5A after depositing a hard-mask layer having an oxidized upper surface, in accordance with one or more aspects of the present invention.
Figure 5C:
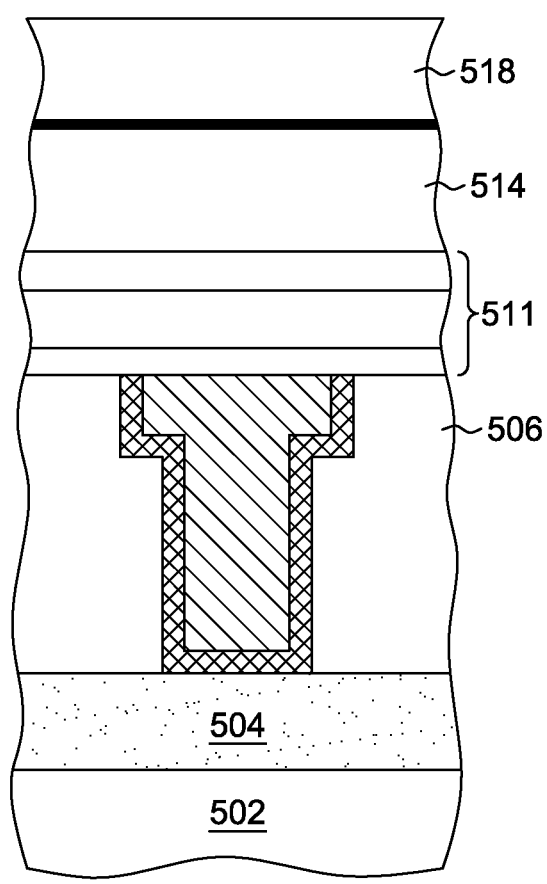
FIG. 5C depicts the structure of FIG. 5B with a dielectric layer having been provided over the hard-mask layer, in accordance with one or more aspects of the present invention.

FIGS. 5A-5C depicts yet another example of an enhanced method for inhibiting diffusion of one or more elements, for instance, between material layers of a layered circuit structure, in accordance with one or more aspects of the present invention. Advantageously, as described below, in this embodiment, the diffusion of one or more elements between material layers of a layered circuit structure may be inhibited by, for instance, altering at least one process parameter employed in the providing of the dielectric layer over the hard-mask layer.

FIG. 5A depicts one embodiment of an intermediate structure 500 obtained during fabrication of a layered circuit structure. In the example shown, intermediate structure 500 includes a substrate 502, such as a semiconductor substrate (for instance, a silicon substrate). As another example, substrate 502 may include any silicon-containing substrate including, but not limited to, silicon (Si), single-crystal silicon, polycrystalline Si, amorphous Si, silicon-on-nothing (SON), silicon-on-insulator (SOI) or silicon-on-replacement insulator (SRI) substrates or the like.

During front-end of line (FEOL) processing, individual devices are created, for instance, in a device layer 504 disposed over substrate 502. As only an example, these individual devices may include metal-oxide-semiconductor field-effect transistors (MOSFETs) such as FinFETs, as well as capacitors, resistors and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or partially connected) semiconductor devices may be fabricated in device layer 504.

After FEOL processing, as well as middle-of-the-line (MOL) processing, back-end of line (BEOL) processing is performed. By way of example, the BEOL processing may include, for instance, silicidation of source and drain regions, deposition of a dielectric layers, and formation of vias and/or trenches in the dielectric layers as metal interconnect layers. During BEOL processing, one or more dielectric layers 506 such as, for instance, pre-metal dielectric (PMD) layers, interlayer dielectric (ILD) layers and intermetal dielectric layers (IMD) may be formed above device layer 404 so as to electrically isolate the respective circuit elements or conductive structures being formed. The dielectric layer(s) 506 may include, for example, silicon oxide deposited and patterned with a network of interconnecting conductive structures (also referred to as interconnecting lines or wiring), for instance, to facilitate the desired interconnection of semiconductor devices in device layer 504 as required implement a particular integrated circuit design. The deposition of dielectric layer(s) 506, followed by subsequent processing to pattern, etch and fill trenches and vias with, for instance, conductive structures 508, may be repeated during BEOL processing such that several metal layers, for example, six to ten metal layers, are deposited and processed in a similar manner. Between each metal layer, hard-mask layers may be formed to protect the underlying layers during the subsequent fabrication processing.

By way of example, dielectric layer 506 may be patterned, using conventional etch processes, to define one or more interconnecting conductive structure(s) 508. In one example, conductive structure 508 may include one or more liners 510 deposited within the patterned openings. A liner refers generally to any film or layer which may form part of the resultant conductive structure, and include (for instance) one or more conformally-deposited layers, such as one or more layers of titanium (Ti), carbon doped titanium, tungsten (W), tungsten nitride (WN), titanium nitride (TiN), tantalum nitride (TaN), titanium aluminum nitride (TiAlN) or the like. Liners 510 may be deposited using conventional deposition processes, for example, atomic layer deposition (ALD), chemical vapor deposition (CVD) or any other suitable process, and facilitate the forming of conductive structures 508 by the subsequent filling of openings with a conductive material 512, such as a metal, for instance, copper, tungsten or the like. A non-selective chemical-mechanical polish may be employed to polish away excess liners 510 and excess conductive material 512 with the chemical-mechanical polishing terminating at, for instance, conductive structure(s) 508, resulting in the height of conductive structure 508 being substantially equal to height of dielectric layer 506 as illustrated.

Further, as noted above, one skilled in the art will note that the BEOL fabrication processing may further include a multilayer stack structure 511 being deposited over the structure. The multilayer stack structure, for instance, may include an etch-stop layer 513a, a layer of dielectric material 513b disposed above etch-stop layer 513a, and a protective hard-mask layer 513c disposed above dielectric layer 513b.

By way of example, etch-stop layer 513a, which may facilitate a subsequent etching processing, may include or be fabricated of nitrogen-doped silicon carbide (N-Blok) material and hydrogen-doped silicon carbide (Blok) material. In another example, etch-stop layer 513a may also include or be fabricated of materials such as, for example, silicon nitride (SiN), silicon carbide (SiC), silicon carbonitride (SiCN) or a combination thereof or any other suitable material, which may be chosen to be compatible with the etch chemistry and technique to be employed. Etch-stop layer 513a may have a minimum thickness such that subsequent processing including an etching process for formation of opening in layers above the etch stop, will properly stop on or at etch-stop layer 513a with enough margin for error. Etch-stop layer 513a, in one embodiment, may be deposited using conventional deposition processes such as, for instance, atomic layer deposition (ALD), chemical vapor deposition (CVD) or the plasma-enhanced versions of the same.

Continuing further with FIG. 1A, a dielectric layer 513b may be provided over etch-stop layer 513b. Although not depicted in the figures, one skilled in the art will understand that the dielectric layer may typically be patterned to define one or more interconnecting conductive structure(s). For instance, the conductive structure(s) may include one or more conductive lines, which support electrical connections along a horizontally-extending length. In another example, conductive structure(s) may also include one or more contact vias which facilitate vertical electrical connection between BEOL metal layers of an integrated circuit.

By way of example, dielectric layer 513b may be deposited from a gaseous phase using any suitable conventional deposition processes, for instance, chemical vapor deposition (CVD), physical vapor deposition (PVD), atomic layer deposition (ALD) or from a liquid phase using a spin-on deposition process. In one example, dielectric layer 513b may include or be fabricated of, for instance, silicon oxide ($SiO_2$), silicon nitride (SiN or $Si_3N_4$), fluorinated silicate glass (FSG). In another example, dielectric layer 513b may also be a material such as medium-k dielectric material (where k, the dielectric constant value, is in the range of about 3.0 to about 6.0 (note that k=3.9 for $SiO_2$)), a low-k dielectric material (where the dielectric constant value is less than 2.7), or an ultra low-k dielectric material (the dielectric constant value is less than 2.7). In one specific example, dielectric layer 513b may include dense or porous materials such as, for example, silicon oxide ($SiO_2$), nitrogen doped silicon carbide (SiCN), fluorine-doped amorphous silicon-oxycarbide (SiCOF), silicon oxycarbide (SiCO), silicon nitride-boron carbide ($Si_3N_4$—$B_4C$). In another specific example, dielectric layer 513b may also include spin-on organosilicate glass material, such as sol-gel films, for example, Nanoglass, and methylsilsesquioxane materials such as, JSR5108 or JSR5109 or LKD (available from JSR), porous SILK (available from Dow Chemical, Midland, Mich.), and BLACK DIAMOND or BLACK DIAMOND II (available from Applied Materials), CORAL (available from Novellus), mesoporous organosilicate glass (OSG), divinyl-siloxane bisbenzocyclobutene (BCB) or other organo dielectric materials having silicon-carbon-oxygen-hydrogen (Si-COH) composition.

Additionally, protective hard-mask layer 513c, which may be used to protect underlying structure during subsequent fabrication, may be provided over dielectric layer 513b. Protective layer 513c, in one specific example, may include or be fabricated of a nitride such as, for example, silicon nitride (SiN or $Si_3N_4$). The deposition process may include any conventional process such as, for example, low temperature CVD, plasma-enhanced CVD or atomic layer deposition (ALD). In another example, protective layer 513c may include or be fabricated of one or more layers of silicon-containing material or a carbon-containing material. In one example, the silicon-containing material may include, for example, silicon oxide ($Si_xO_y$), silicon nitride ($Si_xN_y$), silicon oxynitride ($Si_xO_yN_z$), tetraethyl orthosilicate (TEOS), or octamethylcyclotetrasiloxane (OMCTS) layer, while the carbon-containing material may include, for example, silicon oxycarbide ($Si_xO_yC_z$) or carbon (diamond-like carbon (DLC), amorphous carbon (a-C) or graphite).

FIG. 5B illustrates the structure of FIG. 5A after providing a hard-mask layer 514 over the structure. As used herein, "hard-mask layer" refers generally to a material film or layer which overlies, for instance, the structure and may act as a protective layer for the underlying layers during the subsequent fabrication processing. In one embodiment, hard-mask layer 514, may have a thickness in the range of about 10 to 50 nanometers, and may be deposited using conventional deposition processes such as, for example, physical vapor deposition (PVD), chemical vapor deposition (CVD), pulsed CVD, plasma-enhanced CVD (PECVD), metal organic CVD (MOCVD), atomic layer deposition (ALD), plasma-enhanced ALD (PEALD). By way of example, the hard-mask layer may include or be fabricated of a nitride material such as, for example, titanium nitride (TiN), tantalum nitride (TaN), tungsten nitride (WN), titanium aluminum nitride (TiAlN) or the like. In one example, a titanium nitride (TiN) may be formed using a titanium precursor such as, for example, tetrakis (dimethylamino) titanium (TDMAT) or titanium tetrachloride ($TiCl_4$) and a reagent plasma such as, for example nitrogen plasma at a process temperature of about 600° C. or less during a plasma enhanced ALD (PEALD) processing. In another example, tantalum nitride (TaN) may be formed using a tantalum precursor such as, for example pentakis(dimethylamino)tantalum (PDMAT) and a reagent plasma such as, ammonia plasma during plasma-enhanced ALD (PEALD) processing.

By way of example, a titanium nitride (TiN) hard-mask layer 514 may have a columnar grain structure with a closely-packed face-centered-cubic (fcc) crystal lattice structure. In one implementation, the titanium nitride layer with face-centered-cubic (fcc) crystal lattice structure may favor [111] crystallographic orientations, which have greater surface energy relative to other planes such as, (100), (110) etc. Note that the symbol [hkl] represents the Miller index for the set of equivalent crystal direction within a lattice, and the (hkl) represents the Miller index for the set of equivalent crystal planes. However, note that the columnar grain structure of the titanium nitride (TiN) hard-mask layer may cause the upper surface 516 to be susceptible to atmospheric oxidation upon exposure, owing to one or more voids being inherent to the titanium nitride layer. Such an oxidation results in an oxidized upper surface 516, for instance, a titanium oxynitride ($TiN_xO_y$) being formed over hard-mask layer 514. For instance, one or more atomic oxygen species of atmospheric oxygen may interact with exposed nitrogen disposed at the upper surface of the hard-mask layer forming the oxidized upper surface thereof. Note that the one or more elements of the titanium-oxygen-nitrogen disposed within oxidized upper surface 516 of hard-mask layer 514 may render the oxidized upper surface to be susceptible to undesirable thermodynamic and/or electrochemical instabilities, during subsequent fabrication processing. In one example, the one or more elements of the titanium-oxygen-nitrogen may be or include, for instance, atomic species of titanium (Ti), oxygen (O) and/or nitrogen (N). In another example, the one or more elements may also be or include, for instance, molecular species, such as molecular nitrogen ($N_2$), molecular oxygen ($O_2$), titanium nitride (TiN), and/or titanium oxide ($TiO_2$), etc.

FIG. 5C illustrates the structure of FIG. 5B after providing dielectric layer 518 above the oxidized upper surface 516 (see FIG. 5B) of hard-mask layer 514. By way of example, dielectric layer 518 may include or be fabricated of an oxide material such as, for example, silicon dioxide ($SiO_2$), high-density plasma oxide (HDP-oxide), tetraethyl orthosilicate-oxide (TEOS-oxide) or a combination of such oxide materials. Dielectric layer 518 may be deposited using a variety of the deposition techniques, such as chemical vapor deposition (CVD), low-pressure chemical vapor deposition (LPCVD), sub-atmospheric pressure CVD (SACVD), plasma-enhanced CVD (PECVD) or the like. For instance, dielectric layer 518 may be a layer of silicon dioxide, deposited employing silicon-containing liquid precursor and an oxygen precursor such as, for example, ozone ($O_3$) or oxygen ($O_2$) using LPCVD, SACVD or PECVD processes. As a specific example, the silicon-containing liquid precursor may include, but be not limited to, tetraethyl orthosilicate $Si(OCH_2CH_3)$ (commonly referred to as TEOS), tetramethoxysilane $Si(OCH_3)_4$ (TMOS), octamethylcyclotetrasiloxane $((CH_3)_2SiO)_4$ (OMCTS), hexamethyldisiloxane (HMDSO), tetramethylcyclotetrasiloxane (TMCTS), dimethyldimethoxysilane (DMDMOS), or diethoxymethylsilane (DEMS), among others.

Continuing with FIG. 5C, dielectric layer 518 may be formed employing, for instance, a silicon-containing liquid precursor and an oxygen-containing precursor, in the presence of one or more inert gases such as, helium (He), argon (Ar) and/or nitrogen ($N_2$). Note that, in one embodiment, at least one process parameter, for instance, of a plasma-enhanced chemical vapor deposition (PECVD) process employed in the providing of the dielectric layer, may be altered to facilitate minimizing the forming of the droplets of the silicon-containing liquid precursor over the oxidized upper surface of hard-mask layer 514. In one example, the silicon-containing liquid precursor may be subjected to a stabilization process, prior to being introduced into the process chamber in order to facilitate uniform distribution of the liquid precursor material over the intended surface of the structure disposed within the process chamber. Note that in one example, the liquid precursor may be introduced directly into the process chamber, in the absence of any conventional bubbler or evaporator, which facilitates preventing or minimizing the forming of the droplets of the liquid precursor over hard-mask layer 514. Additionally, the liquid precursor may also be introduced into the process chamber concurrent with or after establishing of the plasma within the process chamber. Such a concurrent or subsequent introducing of the liquid precursor may advantageously facilitate minimizing any undesirable chemical interactions between the liquid precursor material and one or more elements disposed within the oxidized upper surface of the hard-mask layer, and thereby inhibit diffusion of one or more elements from the oxidized upper surface of hard-mask layer 514 into either the hard-mask layer or the resultant dielectric layer. The liquid precursor may instantaneously be energized in presence of the plasma, upon introducing into the process chamber, to form silicon (Si) ions and oxygen ($O_2$) ions. These silicon (Si) ions and oxygen ions may combine to form a layer of silicon oxide over hard-mask layer 514. In one example, the plasma-enhanced process may be performed in the presence of tetraethyl orthosilicate (TEOS) liquid precursor and ozone ($O_3$) gas, at a temperature of about 150° C. to 500° C., with a plasma RF power of about 100 W to 1000 W. Note that the plasma-enhanced process employed to form the silicon oxide dielectric layer 518 may utilize substantially higher temperatures compared to the deposition of hard-mask layer 514, described above.

Alternatively, in another example, at least one process parameter, for instance, of a plasma-enhanced chemical vapor deposition (PECVD) process employed in the providing of dielectric layer 518, may be altered by temporarily delaying introducing the silicon-containing liquid precursor over oxidized upper surface of hard-mask layer 514. In this example, the silicon-containing liquid precursor may be subjected to a stabilization process, prior to introducing into the process chamber so as to facilitate uniform distribution of the liquid precursor material over the surface of the structure disposed within the process chamber. Note that, in one example, the introducing of the liquid precursor may be delayed, for instance, by diverting the liquid precursor material from the process chamber into an adjacent chamber. The liquid precursor material may be introduced into the process chamber, subsequent to optimizing the other process parameters such as, for instance, temperature, pressure or the like. Additionally, in one embodiment, the liquid precursor material may be introduced into the process chamber, subsequent to the establishing of the plasma, thereby facilitating minimizing or preventing undesirable time-lag, which may otherwise initiate undesirable chemical interactions between the liquid precursor and the one or more elements disposed within the oxidized upper surface of the hard-mask layer, and thereby inhibit diffusion of one or more elements from the oxidized upper surface of hard-mask layer 514 into either the hard-mask layer or the resultant dielectric layer. The liquid precursor may instantaneously be energized in presence of plasma, upon introducing into the process chamber, to form silicon (Si) ions and oxygen ($O_2$) ions. These silicon (Si) ions and oxygen ions may combine to form a layer of silicon oxide, over hard-mask layer 514. In one example, the plasma-enhanced process may be performed in the presence of tetraethyl orthosilicate (TEOS) liquid precursor and ozone ($O_3$) gas at a temperature of about 150° C. to 500° C., with a plasma RF power of about 100 W to 1000 W.

Those skilled in the art will note that, advantageously, the diffusion of one or more elements disposed within the oxidized upper surface of the hard-mask layer into either the hard-mask layer or the dielectric layer, during the providing of the dielectric layer over the oxidized upper surface of the hard-mask layer may be inhibited, for instance, by employing one or more of the embodiments disclosed herein. For instance, the diffusion of one or more elements disposed within the oxidized upper surface may be inhibited by modifying at least one characteristic of the hard-mask layer, prior to the providing of the dielectric layer and/or forming a protective layer over the oxidized upper surface of the hard-mask layer. In another example, the diffusion of one or more elements disposed within the oxidized upper surface may be inhibited by, for instance, modifying at least one characteristic of the hard-mask layer, prior to the providing of the dielectric layer and/or altering at least one process parameter employed in the providing of the dielectric layer over the oxidized upper surface of the hard-mask layer. In yet another example, the diffusion of one or more elements disposed within the oxidized upper surface may be inhibited by, for instance, forming a protective layer over the oxidized upper surface of the hard-mask layer, and/or altering at least one process parameter employed in the providing of the dielectric layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    fabricating a layered circuit structure, the fabricating comprising:
        depositing a first material layer above a substrate, the first material layer comprising an oxidized upper surface;
        providing a second material layer directly over the oxidized upper surface of the first material layer; and
        inhibiting diffusion of one or more elements from the oxidized upper surface of the first material layer into either the first material layer or the second material layer during the providing of the second material layer over the oxidized upper surface of the first material layer.

2. The method of claim 1, wherein the inhibiting comprises modifying at least one characteristic of the first material layer, prior to the providing of the second material layer, the modifying inhibiting diffusion of the one or more elements from the oxidized upper surface of the first material layer into either the first material layer or the second material layer during the providing of the second material layer over the oxidized upper surface of the first material layer.

3. The method of claim 2, wherein the modifying comprises annealing the first material layer to, at least in part, alter crystallographic orientation of a material of the first material layer to inhibit diffusion of the one or more elements from the oxidized upper surface of the first material layer into either the first material layer or the second material layer.

4. The method of claim 3, wherein the altered crystallographic orientation is a non-(111) crystallographic orientation.

5. The method of claim 3, wherein the annealing of the first material layer is performed in the absence of an oxygen process gas, and is performed at a temperature within a range of about 300° C. to 1250° C.

6. The method of claim 2, wherein the modifying comprises performing plasma anneal processing of the first material layer, in presence of an oxygen process gas, to at least partially diffuse oxygen into the first material layer, and form an oxidized region within an upper portion of the first material layer adjacent to the oxidized upper surface thereof.

7. The method of claim 6, wherein the plasma anneal processing of the first material layer facilitates stabilizing oxygen within the oxidized region of the first material layer, including the oxidized upper surface thereof.

8. The method of claim 6, wherein the plasma anneal processing of the first material layer is performed at a temperature within a range of about 150° C. to 600° C.

9. The method of claim 1, wherein the inhibiting comprises forming a protective layer directly over the oxidized upper surface of the first material layer, prior to the providing of the second material layer directly over the protective layer, the protective layer facilitating inhibiting diffusion of the one or more elements from the oxidized upper surface of the first material into either the first material layer or the second material layer during the providing of the second material over the oxidized upper surface of the first material layer.

10. The method of claim 9, wherein the forming comprises forming the protective layer at a process temperature approximating a process temperature used during the depositing of the first material layer, the process temperature being within a range of about 600° C. or less.

11. The method of claim 9, further comprising forming the protective layer over the oxidized upper surface of the first material layer in the presence of a gaseous precursor material, the gaseous precursor material comprising a silane precursor.

12. The method of claim 9, wherein the protective layer comprises an oxide material, and the method further comprises providing the second material layer over the protective layer.

13. The method of claim 1, wherein the inhibiting comprises altering at least one process parameter employed in the providing of the second material layer to facilitate minimizing forming of droplets of a second material precursor on the oxidized upper surface of the first material layer during the providing of the second material layer.

14. The method of claim 13, wherein the altering at least one process parameter comprises introducing the second material precursor over the oxidized upper surface of the first material layer, the introducing of the second material precursor being concurrent with or after establishing of a plasma above the first material layer to facilitate minimizing forming of droplets of the second material precursor over the first material layer.

15. The method of claim 13, wherein the altering at least one process parameter comprises delaying introducing the second material precursor over the oxidized upper surface of the first material layer by temporarily diverting the second material precursor from a process chamber having the layered circuit structure disposed therein.

16. The method of claim 13, wherein the second material precursor comprises a liquid precursor material, the liquid precursor material comprising a tetraethyl orthosilicate precursor material.

17. The method of claim 1, wherein the first material layer comprises a first material, and the second material layer comprises a second material, the first material and the second material being different materials, and wherein the first material comprises a nitride material, and the second material comprises an oxide material.

18. The method of claim 1, wherein the inhibiting comprises both modifying at least one characteristic of the first material layer, prior to the providing of the second material layer, and forming a protective layer directly over the oxidized upper surface of the first material layer, and forming the second material layer directly over the protective layer, to facilitate the inhibiting diffusion of the one or more elements from the oxidized upper surface of the first material layer into either the first material layer or the second material layer during the providing of the second material layer over the oxidized upper surface of the first material layer.

19. The method of claim 1, wherein the inhibiting comprises both modifying at least one characteristic of the first material layer, prior to the providing of the second material layer, and altering at least one process parameter employed in the providing of the second material layer to facilitate the inhibiting diffusion of the one or more elements from the oxidized upper surface of the first material layer into either the first material layer or the second material layer.

20. The method of claim 1, wherein the inhibiting comprises both forming a protective layer directly over the oxidized upper surface of the first material layer and forming the second material layer directly over the protective layer, and altering at least one process parameter employed in the providing of the second material layer to facilitate the inhibiting diffusion of the one or more elements from the oxidized upper surface of the first material layer into either the first material layer or the second material layer.

* * * * *